(12) United States Patent
Li et al.

(10) Patent No.: US 12,740,262 B2
(45) Date of Patent: Sep. 15, 2026

(54) DISPLAY PANEL AND DISPLAY DEVICE INCLUDING A DISPLAY REGION AND A FIRST FAN-OUT REGION LOCATED ON A SIDE OF THE DISPLAY REGION

(71) Applicant: Xiamen Tianma Display Technology Co., Ltd., Xiamen (CN)

(72) Inventors: Chengxu Li, Xiamen (CN); Xiangyuan Li, Xiamen (CN); Jiaocheng Wang, Xiamen (CN)

(73) Assignee: Xiamen Tianma Display Technology Co., Ltd., Xiamen (CN)

( * ) Notice: Subject to any disclaimer, the term of this patent is extended or adjusted under 35 U.S.C. 154(b) by 480 days.

(21) Appl. No.: 18/217,383

(22) Filed: Jun. 30, 2023

(65) Prior Publication Data

US 2023/0354660 A1 Nov. 2, 2023

(30) Foreign Application Priority Data

Jun. 30, 2022 (CN) ........................ 202210773002.9

(51) Int. Cl.
*H10K 59/131* (2023.01)

(52) U.S. Cl.
CPC .................................. *H10K 59/131* (2023.02)

(58) Field of Classification Search
CPC .................................................... H10K 59/131
USPC ............................................................ 257/71
See application file for complete search history.

(56) References Cited

U.S. PATENT DOCUMENTS

2021/0336197 A1* 10/2021 Sun ........................ H10D 86/60

* cited by examiner

*Primary Examiner* — Xia L Cross
(74) *Attorney, Agent, or Firm* — KDW Firm PLLC

(57) ABSTRACT

Provided are a display panel and a display device. The display panel includes a display region and a first fan-out region located on a side of the display region. The display region further includes a substrate and a first metal layer, a second metal layer and a third metal layer which are located on a side of the substrate and are located at the first fan-out region and are sequentially disposed in different layers insulated from one another, where the first metal layer includes multiple first signal lines, the second metal layer includes multiple second signal lines, and the third metal layer includes multiple third signal lines. In the direction perpendicular to the plane where the substrate is located, at least one third signal line overlaps one first signal line, and the at least one third signal line overlaps one second signal line.

19 Claims, 13 Drawing Sheets

DISPLAY PANEL AND DISPLAY DEVICE INCLUDING A DISPLAY REGION AND A FIRST FAN-OUT REGION LOCATED ON A SIDE OF THE DISPLAY REGION

CROSS-REFERENCE TO RELATED APPLICATION

This application claims priority to Chinese Patent Application No. 202210773002.9 filed Jun. 30, 2022, the disclosure of which is incorporated herein by reference in its entirety.

TECHNICAL FIELD

The present disclosure relates to the field of display technologies and, in particular, to a display panel and a display device.

BACKGROUND

A display panel includes a display region and a peripheral non-display region. The display region is a region for displaying images, and multiple pixels are disposed in the display region. The peripheral non-display region generally includes a fan-out region, and multiple signal lines are disposed in the fan-out region and are distributed in a fan shape for connecting lines in the display region and a driver chip located outside the display region, so as to achieve the control of the light emission state of various pixels in the display region by the driver chip.

With the development of display technologies, the screen resolution becomes increasingly higher, the number of pixels per inch (ppi) is increasing, the signal traces on the display panel are increasingly denser, and accordingly, the number of signal lines in the fan-out region is increasing, resulting in that the area of the fan-out region needs to be adaptively increased, which is not in line with the current development trend of the narrow bezel.

SUMMARY

The present disclosure provides a display panel and a display device.

According to an aspect of the present disclosure, a display panel is provided. The display panel includes a display region and a first fan-out region located on a side of the display region.

The display panel further includes a substrate and a first metal layer, a second metal layer and a third metal layer which are located on a side of the substrate and are located at the first fan-out region and are sequentially disposed in different layers insulated from one another, where the first metal layer includes a plurality of first signal lines, the second metal layer includes a plurality of second signal lines, and the third metal layer includes a plurality of third signal lines.

In a direction perpendicular to the plane where the substrate is located, at least one third signal line overlaps one first signal line, and the at least one third signal line overlaps one second signal line.

In another aspect, the present disclosure provides a display device including the display panel provided in any embodiment of the present disclosure.

It is to be understood that the contents described in this part are not intended to identify key or important features of the embodiments of the present disclosure and are not intended to limit the scope of the present disclosure. Other features of the present disclosure will become readily understood through the description hereinafter.

BRIEF DESCRIPTION OF DRAWINGS

To illustrate technical solutions in embodiments of the present disclosure more clearly, drawings used in description of the embodiments will be briefly described below. Apparently, the drawings described below merely illustrate part of the embodiments of the present disclosure, and those of ordinary skill in the art may obtain other drawings based on the drawings on the premise that no creative work is done.

FIG. 29 is a structural diagram of a display device according to an embodiment of the present disclosure.

DETAILED DESCRIPTION

The technical solutions in embodiments of the present disclosure will be described clearly and completely in conjunction with the drawings in the embodiments of the present disclosure from which the solutions of the present disclosure will be better understood by those skilled in the art. Apparently, the embodiments described below are part, not all, of the embodiments of the present disclosure. Based on the embodiments of the present disclosure, all other embodiments obtained by those of ordinary skill in the art on the premise that no creative work is done are within the scope of the present disclosure.

Figure 1:
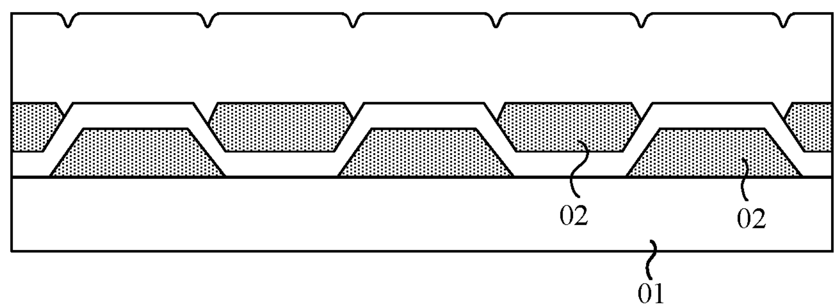
FIG. 1 is a sectional view of a fan-out region in the related art.

FIG. 1 is a sectional view of a fan-out region in the related art. As shown in FIG. 1, the fan-out region includes multiple signal lines 02, and the section shown in FIG. 1 is perpendicular to the plane where a substrate 01 is located and intersects with the extension direction of the signal lines 02. Referring to FIG. 1, in the prior art, the signal lines 02 are disposed in two film layers insulated from each other, so that the distance between adjacent signal lines 02 can be shortened, a relatively large number of signal lines 02 can be disposed in the same space compared with all signal lines 02 located in the same film layer, and thus the effect of reducing the area of the fan-out region can be achieved to a certain extent. However, the effect of reducing the area of the fan-out region is limited in this solution. In view of this, to further reduce the area of the fan-out region, three metal layers disposed insulated from one another may be used for the signal line design of the fan-out region.

Figure 2:
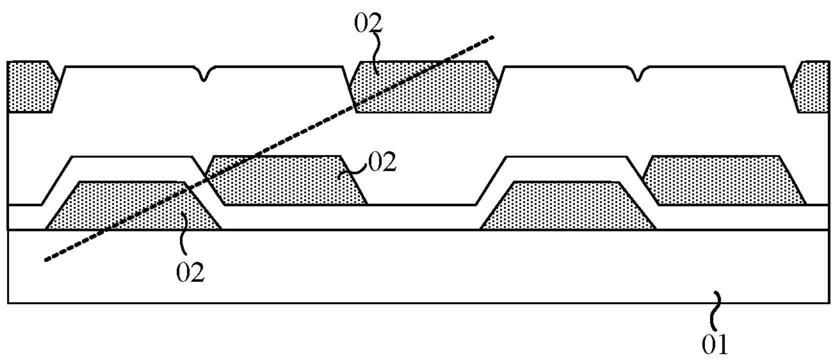
FIG. 2 is a sectional view of another fan-out region in the related art.
Figure 3:
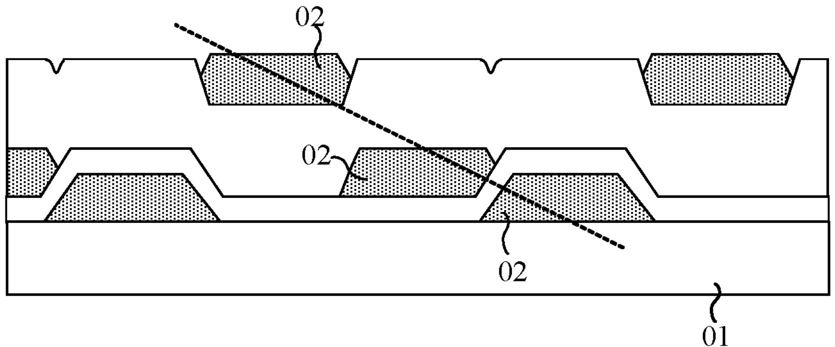
FIG. 3 is a sectional view of another fan-out region in the related art.

FIG. 2 is a sectional view of another fan-out region in the related art, and FIG. 3 is a sectional view of another fan-out region in the related art. The section shown in FIG. 2 and the section shown in FIG. 3 are also perpendicular to the plane where the substrate 01 is located and intersect with the extension direction of the signal lines 02. As shown in FIG. 2 or FIG. 3, in this solution, the signal lines 02 of the fan-out region are disposed in three metal layers insulated from one another, respectively, and signal lines 02 in each layer have almost no overlap in the thickness direction of the display panel and are of a diagonal design. In this manner, since no overlap exists between the signal lines 02, the difference in parasitic capacitance between the signal lines 02 can be avoided, so that the uniformity of display brightness can be ensured. However, the number of signal lines 02 that can be disposed in the same space in this solution is substantially the same as the setting manner shown in FIG. 1, and therefore, the effect of reducing the area of the fan-out region is limited.

Figure 4:
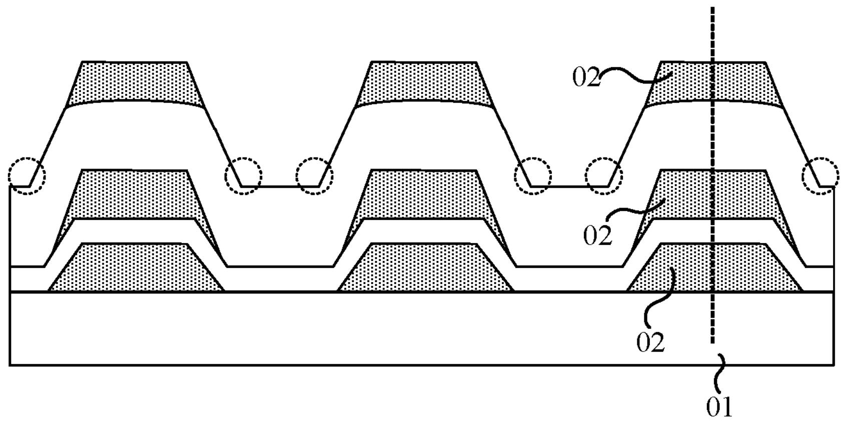
FIG. 4 is a sectional view of another fan-out region in the related art.

FIG. 4 is a sectional view of another fan-out region in the related art. The section is also perpendicular to the plane where the substrate 01 is located and intersects with the extension direction of the signal lines 02. As shown in FIG. 4, in this solution, the signal lines 02 of the fan-out region are disposed in three metal layers disposed insulated from one another, respectively, and various signal lines 02 are disposed overlapping one another in the thickness direction of the display panel and are of a straight line design. In this manner, the number of signal lines 02 in the same space can be significantly increased to achieve the effect of reducing the area of the fan-out region. However, as can be seen from FIG. 4, this solution causes an increase in steps of regions between signal lines 02 in the third layer and adjacent signal lines 02 and deepening of the recesses due to the stacking of the signal lines 02. As a result, during the manufacturing process of another conductive layer above the third layer of signal lines 02, it is easy to cause incomplete exposure of the conductive layer at the bottom corner of the recesses (such as the positions marked by circular dotted lines in FIG. 4) due to the relatively deep recesses and thus to lead to incomplete etching, so that part of the conductive layer remains at the bottom corner of the recesses, resulting in the risk of the short circuit. In addition, in the solution shown in FIG. 4, since the overlapping area between the signal lines 02 in different layers is relatively large, the parasitic capacitance increases and the load increases, so that the power consumption increases. Furthermore, the solution shown in FIG. 4 has a higher requirement for process accuracy, and if the overlapping area between signal lines 02 in different regions is different due to process fluctuation, the difference in the parasitic capacitance corresponding to the signal lines 02 in the different regions is produced, thereby affecting the display effect, and resulting in non-uniform display brightness of subpixels corresponding to different signal lines 02.

In summary, none of the solutions in the prior art and the related art can reduce the area of the fan-out region to achieve the narrow bezel while the display effect is ensured. To solve the preceding problem, the embodiment of the present disclosure provides a display panel. The display panel includes a display region and a first fan-out region located on a side of the display region. The display region further includes a substrate and a first metal layer, a second metal layer and a third metal layer which are located on a side of the substrate and are located at the first fan-out region and are sequentially disposed in different layers insulated from one another, where the first metal layer includes multiple first signal lines, the second metal layer includes multiple second signal lines, and the third metal layer includes multiple third signal lines. In the direction perpendicular to the plane where the substrate is located, at least one third signal line overlaps the first signal line, and the at least one third signal line overlaps the second signal line.

Through the preceding solution, since one third signal line overlaps both the first signal line and the second signal line, a larger number of signal lines can be disposed in the same space, so that the area of the first fan-out region is reduced. In addition, in this manner, even if the position of the third signal lines deviates due to process fluctuation, it can be ensured that the total overlapping area between the third signal lines and the first signal lines and the second signal lines does not change, so that the difference in parasitic capacitance corresponding to different third signal lines is avoided, the consistency of the electrical environment where the third signal lines are located is ensured, and the brightness uniformity of subpixels corresponding to the third signal lines is further ensured. Therefore, the area of the fan-out region is reduced to achieve the narrow bezel while the display effect is ensured.

The preceding is the core idea of the present application. Based on the embodiments of the present application, all other embodiments obtained by those of ordinary skill in the art on the premise that no creative work is done are within the scope of the present application. The technical solutions in the embodiments of the present application are described clearly and completely hereinafter in conjunction with the drawings in the embodiments of the present application.

Figure 5:
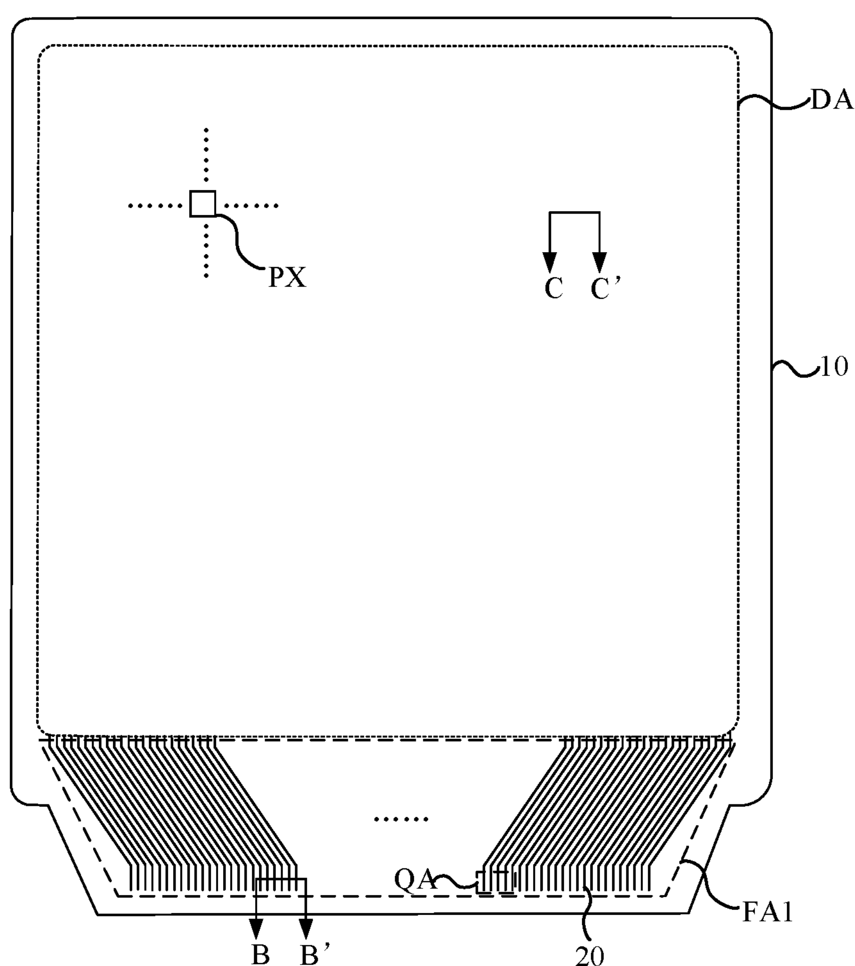
FIG. 5 is a top view of a display panel according to an embodiment of the present disclosure.
Figure 6:
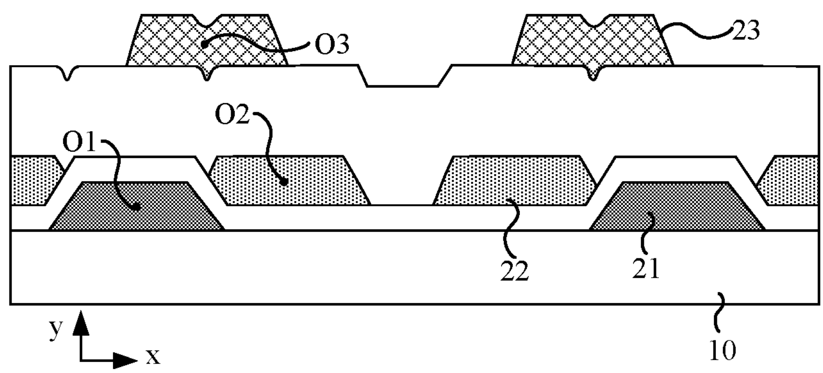
FIG. 6 is a sectional view of the display panel taken along BB' in FIG. 5.

FIG. 5 is a top view of a display panel according to an embodiment of the present disclosure, and FIG. 6 is a sectional view of the display panel taken along BB' in FIG. 5. As shown in FIG. 5 and FIG. 6, the display panel 100 provided in the embodiment of the present disclosure includes a display region DA and a first fan-out region FA1 located at a side of the display region DA. The display panel 100 further includes a substrate 10 and a first metal layer, a second metal layer and a third metal layer which are located on a side of the substrate and are located at the first fan-out region FA1 and are sequentially disposed in different layers insulated from one another, where the first metal layer includes multiple first signal lines 21, the second metal layer includes multiple second signal lines 22, and the third metal layer includes multiple third signal lines 23. In the direction perpendicular to the plane where the substrate 10 is located, at least one third signal line 23 overlaps a first signal line 21, and the at least one third signal line 23 overlaps a second signal line 22.

The first fan-out region FA1 refers to the fan-out region located at the non-display region of the bezel of the display panel and closest to the display region DA. In the embodiment of the present disclosure, the layout of the signal lines in the first fan-out region FA1 is adjusted, so that the area of the first fan-out region FA1 can be reduced, and thus the size of the bezel is reduced and the narrow bezel achieved.

It is to be noted that a display module (including structures such as a display panel, a circuit board and a driver chip) may include more than the preceding first fan-out region FA1. Exemplarily, when the Chip on Film (COF) technology is used for fixing the driver chip on the flexible circuit board, the first fan-out region FA1, a binding region and a second fan-out region located on the flexible circuit board which are sequentially disposed are mainly included between the display region DA and the driver chip. At this time, signal lines in other fan-out regions (such as the second fan-out region) in the display module may also be deployed by using the technical solution in the embodiment of the present disclosure to reduce the area of the fan-out region and leave a space for setting other structures. The embodiment of the present disclosure is described only by taking the design of the signal lines in the first fan-out region FA1 as an example.

As shown in FIG. 5, the first fan-out region FA1 mainly includes multiple data signal lines 20, and the general extension direction of the data signal lines 20 is the direction from which the first fan-out region FA1 points to the display region DA. The data signal lines 20 are used for connecting data lines in the display region DA and data output ports of the driver chip, so as to achieve the transmission of data signals. In the prior art, multiple multiplexing circuits may be disposed between the display region DA and the first fan-out region FA1, so that one data signal line 20 can be electrically connected to at least two data lines in the display region DA via the multiplexing circuits to match a relatively small number of data output ports of the driver chip and a large number of data lines in the display region DA. It is to be noted that the general extension direction of the data signal lines 20 is the direction from which the first fan-out region FA1 points to the display region DA, and represents that the data signal lines 20 have a component in the direction from which the first fan-out region FA1 points to the display region DA. The inclination angle of the data signal lines 20 is not specifically limited.

In the embodiment, the first signal lines 21, the second signal lines 22 and the third signal lines 23 may transmit the same type signals. For example, the first signal lines 21, the second signal lines 22 and the third signal lines 23 may all transmit data signals; in other words, the first signal lines 21, the second signal lines 22 and the third signal lines 23 may all be data signal lines. Of course, the first signal lines 21, the second signal lines 22 and the third signal lines 23 may also include other types of signal lines in addition to the data signal line, which is not limited in the embodiment of the present disclosure. In the embodiment, the first signal lines 21, the second signal lines 22 and the third signal lines 23 may transmit scanning signals or emission control signals. Optionally, the first signal lines 21, the second signal lines 22, and the third signal lines 23 transmit the same type of signal, as well as different types of signals. For example, the first signal lines 21, the second signal lines 22, and the third signal lines 23 transmit scanning signals or emission control signals, or the first signal lines 21, the second signal lines 22, and the third signal lines 23 partially transmit scanning signals and partially transmit data signals. Subsequently, only the example is illustrated in which the first signal lines 21, the second signal lines 22 and the third signal lines 23 are data signal lines for transmitting data signals.

Referring to FIG. 6, in the embodiment, film layers where the first signal lines 21, the second signal lines 22 and the third signal lines 23 are located are sequentially disposed insulated from one another. In the direction perpendicular to the plane where the substrate 10 is located, at least one third signal line 23 overlaps both one first signal line 21 and one second signal line 22. In this manner, a larger number of signal lines can be disposed in the same space, so that the area of the first fan-out region FA1 can be reduced to achieve the narrow bezel. In some embodiments, each third signal lines 23 overlaps both one first signal line 21 and one second signal line 22, so that as many signal lines as possible are disposed in the same space. In addition, since one third signal line 23 overlaps both one first signal line 21 and one second signal line 22, even if the position of any third signal line 23 deviates due to process fluctuation, it can be ensured that the total overlapping area between the one third signal line 23 and the one first signal line 21 and the one second signal line 22 does not change, so that the difference in parasitic capacitance corresponding to different third signal lines 23 is avoided, the consistency of the electrical environment where the third signal lines 23 are located is ensured, the brightness uniformity of subpixels corresponding to the third signal lines 23 is further ensured, and thus the display effect is ensured.

In some embodiments, the first metal layer where the first signal lines 21 are located, the second metal layer where the second signal lines 22 are located and the third metal layer where the third signal lines 23 are located may multiplex the original three metal layers disposed in difference layers in the display region DA, respectively, so as to avoid adding additional metal film layers and facilitate satisfying the design requirements for a thin display panel. The film layers where the first signal lines 21, the second signal lines 22 and the third signal lines 23 are located are described in detail subsequently and are not repeated here.

In summary, in the embodiment of the present disclosure, the first signal lines, the second signal lines and the third signal lines in the first fan-out region are disposed in the first metal layer, the second metal layer and the third metal layer which are sequentially disposed in different layers, respectively, and at least one third signal line overlaps one first signal line in the direction perpendicular to the plane where the substrate is located, and the at least one third signal line also overlaps one second signal line in the direction perpendicular to the plane where the substrate is located, so that a larger number of signal lines can be disposed in the same space, and thus the area of the first fan-out region is reduced. In addition, in this manner, even if the position of the third signal lines deviates due to process fluctuation, it can be ensured that the total overlapping area between the third signal lines and the first signal lines and the second signal lines does not change, so that the difference in parasitic capacitance corresponding to different third signal lines is avoided, the consistency of the electrical environment where the third signal lines are located is ensured, and the brightness uniformity of subpixels corresponding to the third signal lines is further ensured. Therefore, the area of the fan-out region is reduced to achieve the narrow bezel while the display effect is ensured.

Based on the preceding embodiments, the relative position relationship and setting manner of the first signal lines 21, the second signal lines 22 and the third signal lines 23 are described in further detail below.

Figure 7:
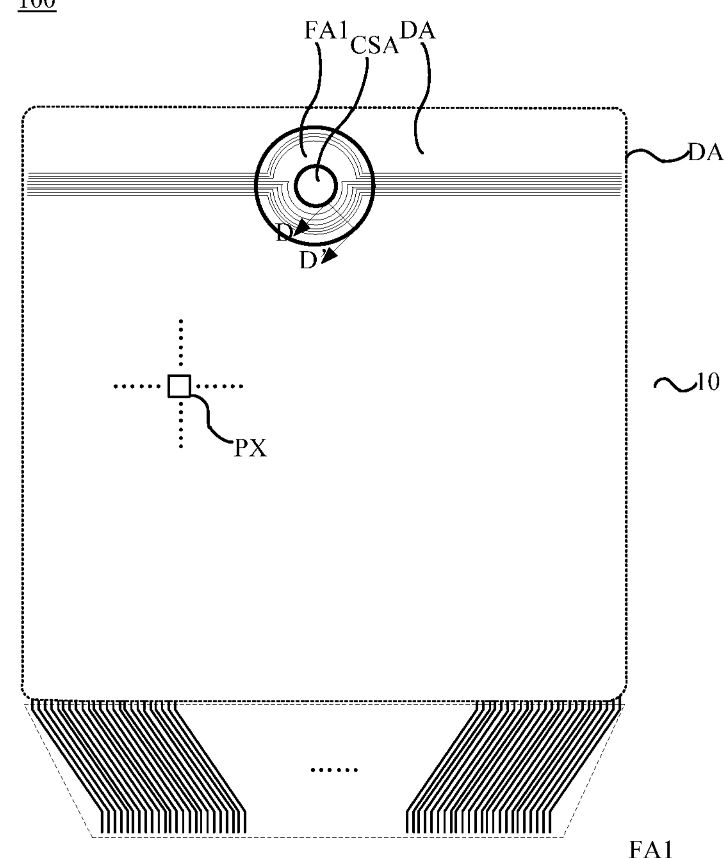
FIG. 7 is a top view of a display panel according to an embodiment of the present disclosure.

As shown in the FIG. 7, the first fan out area FA1 is located on one side of the display region DA, and the first fan-out region FA1 is located in the optical element setting region NDA and display region DA; Optionally, the optical component setting region CSA can set optical components, achieve functions such as taking photos, and increase the screen occupation ratio. The first fan-out region FA1 includes multiple signal line layouts, which can reduce the area of the first fan-out region FA1, thereby reducing the non-display region occupied by the first fan out area FA1. Optionally, the optical component settings can be displayed in the optical component setting region CSA, which includes some sub pixels. In another embodiment, the optical component settings area can also be displayed without sub pixels.

It should be noted that the display panel include multiple first fan-out region, as shown in the figure. The display panel simultaneously includes two first fan-out region FA1, and the lines set in both first fan-out region using the implementation method of the present application, or just one fi first fan-out region can include the structure of the implementation method of the present application. The first sector is the name of an area without any additional restrictions.

Figure 8:
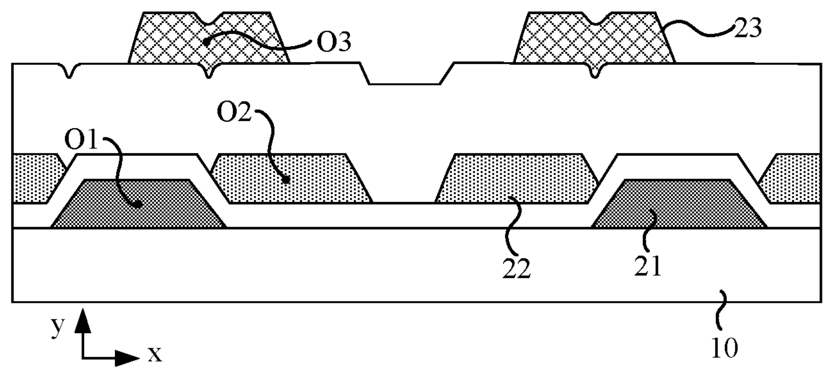
FIG. 8 is a sectional view of the display panel taken along BB' in FIG. 7.

Referring to FIG. 8, in the embodiment, film layers where the first signal lines 21, the second signal lines 22 and the third signal lines 23 are located are sequentially disposed insulated from one another. In the direction perpendicular to the plane where the substrate 10 is located, at least one third signal line 23 overlaps both one first signal line 21 and one second signal line 22. In this manner, a larger number of signal lines can be disposed in the same space, so that the area of the first fan-out region FA1 can be reduced to achieve the narrow bezel. In some embodiments, each third signal lines 23 overlaps both one first signal line 21 and one second signal line 22, so that as many signal lines as possible are disposed in the same space. In addition, since one third signal line 23 overlaps both one first signal line 21 and one second signal line 22, even if the position of any third signal line 23 deviates due to process fluctuation, it can be ensured that the total overlapping area between the one third signal line 23 and the one first signal line 21 and the one second signal line 22 does not change, so that the difference in parasitic capacitance corresponding to different third signal lines 23 is avoided, the consistency of the electrical environment where the third signal lines 23 are located is ensured, the brightness uniformity of subpixels corresponding to the third signal lines 23 is further ensured, and thus the display effect is ensured.

In the embodiment, the first signal lines 21, the second signal lines 22 and the third signal lines 23 may transmit scanning signals or emission control signals. Optionally, the first signal lines 21, the second signal lines 22, and the third signal lines 23 transmit the same type of signal, as well as different types of signals. For example, the first signal lines 21, the second signal lines 22, and the third signal lines 23 transmit scanning signals or emission control signals, or the first signal lines 21, the second signal lines 22, and the third signal lines 23 partially transmit scanning signals and partially transmit data signals.

Figure 9:
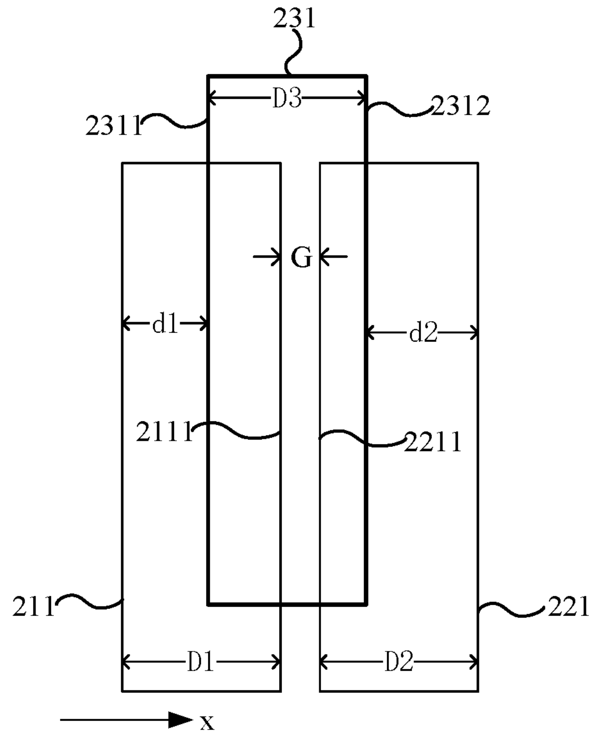
FIG. 9 is an enlarged view of region QA in FIG. 5.

FIG. 9 is an enlarged view of region QA in FIG. 5, illustrating the relative position relationship between orthographic projections of a first signal line 21, a second signal line 22 and a third signal line 23 on the substrate 10. As shown in FIG. 9, the orthographic projection of the first signal line 21 on the substrate 10 is a first projection 211, the orthographic projection of the second signal line 22 on the substrate 10 is a second projection 221, and the orthographic projection of the third signal line 23 on the substrate 10 is a third projection 231. A first edge 2311 of the third projection 231 is located within the first projection 211, and a second edge 2312 of the third projection 231 is located within the second projection 221. In a first direction x, the first edge 2311 and the second edge 2312 are oppositely disposed. The first direction x is perpendicular to the extension direction of the third signal line 23. It is to be noted that to facilitate distinguishing, FIG. 9 shows that the first projection 211 (or the second projection 221) and the third projection 231 are vertically offset. In fact, in the same region, the top boundary of the third projection 231 is flush with the top boundary of the first projection 211 (or the second projection 221), and the bottom boundary of the third projection 231 is flush with the bottom boundary of the first projection 211 (or the second projection 221).

The orthographic projection (that is, the first projection 211) of the first signal line 21 on the substrate 10 may be understood as the largest orthographic projection of the first signal line 21 on the substrate 10. Exemplarily, referring to FIG. 6, in the thickness direction (for example, a y direction) of the display panel, the length of the first signal line 21 from the bottom surface to the top surface in the first direction x gradually decreases due to the etching process; as a result, orthographic projections of sections at different thickness of the first signal line 21 on the substrate 10 are different in size, the orthographic projection of the bottom surface of the first signal line 21 on the substrate 10 is the largest, and the orthographic projection of the top surface of the first signal line 21 on the substrate 10 is the smallest. At this time, the first projection 211 specifically refers to the orthographic projection of the bottom surface of the first signal line 21 on the substrate 10. Similarly, the orthographic projection (that is, the second projection 221) of the second signal line 22 on the substrate 10 may be understood as the largest orthographic projection of the second signal line 22 on the substrate 10, and the orthographic projection (that is, the third projection 231) of the third signal line 23 on the substrate 10 may be understood as the largest orthographic projection of the third signal line 23 on the substrate 10.

In the embodiment, the first edge 2311 of the third projection 231 is located within the first projection 211, and the second edge 2312 of the third projection 231 is located within the second projection 221, so that it can be ensured that the third signal line 23 overlaps both the first signal line 21 and the second signal line 22. In this manner, the area of the fan-out region FA1 is reduced to achieve the narrow bezel while the display effect is ensured. Furthermore, since the first edge 2311 of the third projection 231 is located within the first projection 211 and the second edge 2312 of the third projection 231 is located within the second projection 221, the first projection 211 and the second projection 221 at least partially do not overlap. In some embodiments, at least the part of the first projection 211 on the side of the first edge 2311 far away from the second edge 2312 does not overlap the part of the second projection 221 on the side of the second edge 2312 far away from the first edge 2311, so that the first signal line 21 and the second signal line 22 at least partially do not overlap in the direction perpendicular to the plane where the substrate 10 is located. Referring to FIG. 6, the orthographic projection of the first signal line 21 and the orthographic projection of the second signal line 22 on the substrate overlap only at a very small part of adjacent sidewalls, and the remaining parts of the orthographic projection of the first signal line 21 and the orthographic projection of the second signal line 22 on the substrate do not overlap, so that steps between the third signal lines 23 are significantly reduced; therefore, the situation can be improved where part of the conductive layer above the third signal lines 23 remains during the manufacturing process, and the risk of the short circuit of the film layer can be reduced.

Further, with continued reference to FIG. 9, the edge of the first projection 211 facing a third projection 231 side is a third edge 2111, and the edge of the second projection 221 facing the third projection 231 side is a fourth edge 2211. In some embodiments, the fourth edge 2211 and the third edge 2111 are located within the third projection 231. In this manner, it can be ensured that the third signal line 23 overlaps both the first signal line 21 and the second signal line 22; therefore, the area of the fan-out region FA1 is reduced to achieve the narrow bezel while the display effect is ensured.

Figure 10:
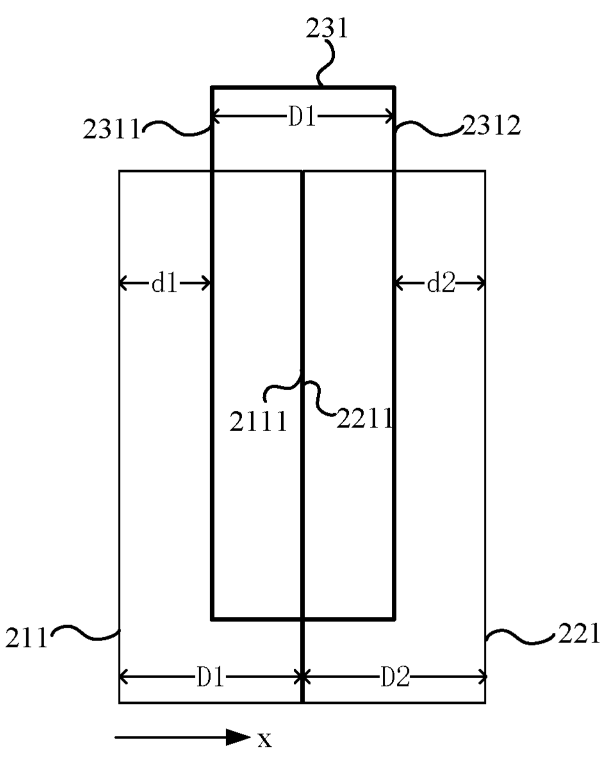
FIG. 10 is another enlarged view of region QA in FIG. 5.

Further, referring to FIG. 9, the distance between the fourth edge 2211 and the third edge 2111 is G. In some embodiments, $G \geq 0$. Exemplarily, FIG. 9 shows the case where $G>0$. FIG. 10 is another enlarged view of region QA in FIG. 5. As shown in FIG. 10, in other embodiments, it may be set that $G=0$; at this time, the third edge 2111 is contiguous to the fourth edge 2211, that is, $G=0$. In the embodiment of the present disclosure, the distance G between the fourth edge 2211 and the third edge 2111 is set to satisfy that $G \geq 0$, so that the first signal line 21 and the second signal line 22 do not overlap in the direction perpendicular to the plane where the substrate 10 is located; therefore, the crosstalk between the first signal line 21 and the second signal line 22 can be avoided, the accuracy of signal transmission can be ensured, and the display effect can be ensured. In addition, when $G=0$, not only the crosstalk between the first signal line 21 and the second signal line 22 can be reduced, but also a larger number of first signal lines 21 and second signal lines 22 can be disposed in the same space, which is more conducive to reducing the area of the first fan-out region FA1.

Exemplarily, referring to FIG. 9, the width of the first projection 211 is D1. When $G>0$, in some embodiments, it may be set that $10\%*D1 \leq G \leq 20\%*D1$. The width of the first projection 211 is the width of the first signal line 21. The excessively large distance G between the third edge 2111 and the fourth edge 2211 is not conducive to reducing the area of the first fan-out region FA1, so that G should not be excessively large. In the embodiment, it is set that $10\%*D1 \leq G \leq 20\%*D1$, so that the effect of reducing the area of the first fan-out region FA1 can be ensured while the crosstalk between the first signal line 21 and the second signal line 22 is avoided. In some embodiments, in a specific implementation, it may be set that $D1=1.6$ μm and $G=0.3$ μm. It is to be noted that the width of the first projection is the projection width in the direction perpendicular to the extension direction of the first signal line.

With continued reference to FIG. 9, the distance from the first edge 2311 to the edge of the first projection 211 on the side far away from the third projection 231 is d1, and the distance from the second edge 2312 to the edge of the second projection 221 on the side far away from the third projection 231 is d2; in some embodiments, $d1>0$, and $d2>0$. In this manner, even if the position of the third signal line 23 deviates due to process fluctuation, the total overlapping area between the third signal line 23 and the first signal line 21 and the second signal line 22 does not change, so that the display effect can be ensured. It is to be noted that d1 and d2 may be equal (as shown in FIG. 10) or unequal (as shown in FIG. 9) to each other, and the distance between the third edge 2111 and the fourth edge 2211 and the size relationship between d1 and d2 are two independent features, and may be formed in any combination, which are not limited in the embodiment of the present disclosure.

Figure 11:
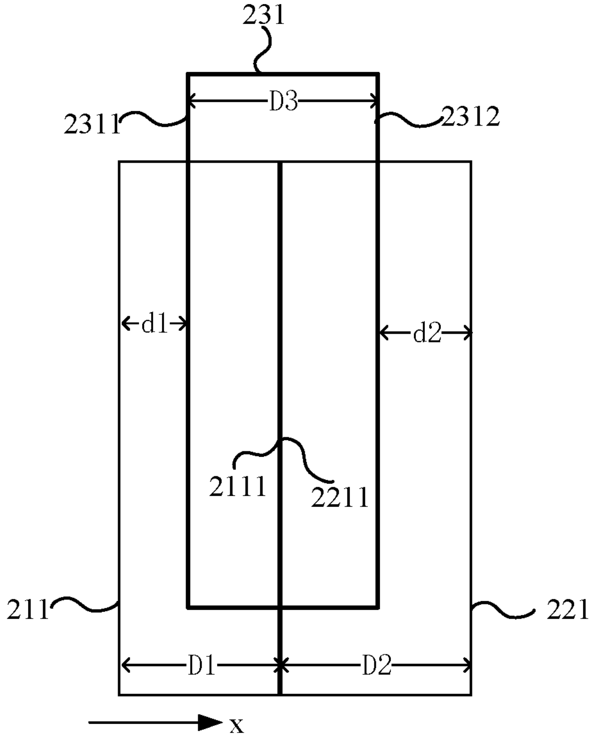
FIG. 11 is another enlarged view of region QA in FIG. 5.

In some embodiments, FIG. 11 is another enlarged view of region QA in FIG. 5. As shown in FIG. 10 and FIG. 11, in the first direction x, the width of the first projection 211 is D1, and the width of the second projection 221 is D2; in some embodiments, it may be set that $(D1-D2)*(d1-d2)>0$. The width of the second projection 221 is the width of the second signal line 22.

In another optional implementation, as shown in FIG. 10, it may be set that $D1=D2$, and $d1=d2$. In this manner, even if the position of the third signal line 23 deviates due to process fluctuation, the total overlapping area between the third signal line 23 and the first signal line 21 and the second signal line 22 does not change, so that the display effect can be ensured. Furthermore, since the width of the first signal line 21 is equal to the width of the second signal line 22 (that is, $D1=D2$), the trace resistance of the first signal line 21 and the trace resistance of the second signal line 22 can be kept the same, which is conducive to improving the uniformity of display brightness; in addition, the first signal line and the second signal line may also be formed by using the same mask plate, so as to reduce the production cost. Further, since $d1=d2$, the third projection 231 is located on the central position of the first projection 211 and the second projection 221, so that the overlapping area between the third signal line 23 and the first signal line 21 is the same as the overlapping area between the third signal line 23 and the second signal line 22, and thus it is avoided that the overlapping area between the third signal line 23 and the first signal line 21 or the overlapping area between the third signal line 23 and the second signal line 22 is too large. Moreover, even if the position of the third signal line 23 deviates due to process fluctuation, it can be avoided that the overlapping area between the third signal line 23 and the first signal line 21 or the overlapping area between the third signal line 23 and the second signal line 22 is too large, so that it can be avoided that the crosstalk between the third signal line 23 and the first signal line 21 or the crosstalk between the third signal line 23 and the second signal line 22 produces too much impact, and thus the display effect is further ensured. Of course, in other embodiments, it may be set that $D1=D2$ or $d1=d2$, which is not limited in the embodiment of the present disclosure.

In another optional implementation, as shown in FIG. 11, the width of the first signal line 21 is less than the width of the second signal line 22, that is, $D1<D2$, and $d1<d2$. In this manner, even if the position of the third signal line 23 deviates due to process fluctuation, the total overlapping area between the third signal line 23 and the first signal line 21 and the second signal line 22 does not change, so that the display effect can be ensured. Furthermore, when the width of the first signal line 21 is less than the width of the first signal line 22, that is, D1<D2, it is set that d1<d2 in the embodiment, so that it can be achieved that the overlapping area between the third signal line 23 and the first signal line 21 is substantially the same as the overlapping area between the third signal line 23 and the second signal line 22. In this manner, when the position of the third signal line 23 deviates due to process fluctuation, it can be avoided that the overlapping area between the third signal line 23 and the first signal line 21 or the overlapping area between the third signal line 23 and the second signal line 22 is too large, so that it can be avoided that the crosstalk between the third signal line 23 and the first signal line 21 or the crosstalk between the third signal line 23 and the second signal line 22 produces too much impact, and thus the display effect is further ensured. Of course, this setting manner is not limiting, and in other embodiments, it may be set that D1>D2 and d1>d2.

Figure 12:
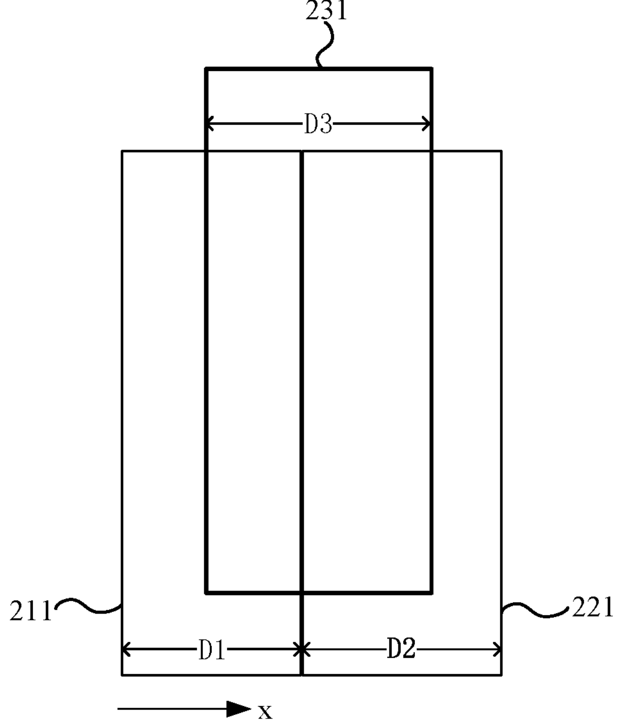
FIG. 12 is another enlarged view of region QA in FIG. 5.

In addition, FIG. 12 is another enlarged view of region QA in FIG. 5. As shown in FIG. 10 and FIG. 12, in the first direction x, the width of the first projection 211 is D1, the width of the second projection 221 is D2, and the width of the third projection 231 is D3; in some embodiments, it may be set that D1≤D2≤D3.

In some embodiments, the example in which D1=D2=D3 is illustrated in FIG. 10. In this manner, the width of the first signal line 21, the width of the second signal line 22 and the width of the third signal line 23 can be set the same, and then the trace resistance of the first signal line 21, the trace resistance of the second signal line 22 and the trace resistance of the third signal line 23 can be kept the same, which is conducive to improving the uniformity of display brightness. In addition, the first signal line 21, the second signal line 22 and the third signal line 23 may be formed by using the same mask plate, so as to reduce the production cost.

In other embodiments, referring to FIG. 12, it may be set that D1<D2<D3. In this manner, in the IC on film (COF) technical solution, when the flexible circuit board is bent toward the back of the display panel, the third signal lines are greatly affected by stress since the third signal lines are facing the top surface of the bending region, and the second signal lines and the first signal lines are successively less affected by the stress; therefore, it is set that D1<D2<D3, so that degrees of the impact of the stress on signal lines in different layers can be matched, and the risk of the third signal lines breaking is reduced.

Of course, in other embodiments, it may also be set that D1<D2=D3 or D1=D2<D3, which is not limited in the embodiment of the present disclosure.

It is to be noted that if not in conflict, the preceding setting manners may be combined with each other. In some embodiments, the setting manners of D1, D2, D3, d1 and d2 are shown in FIGS. 8 to 10 through the example where G=0, and when G>0, the preceding setting manners of D1, D2, D3, d1 and d2 may also be used, which is not repeated here.

In summary, the preceding embodiments describe in detail the relative position relationship and setting manner of the various signal lines from the perspective of the orthographic projections of the first signal line 21, the second signal line 22 and the third signal line 23 on the substrate 10. Next, the relative position relationship and setting manner of the various signal lines are further described in detail from the perspective of sections perpendicular to the plane where the substrate 10 is located.

Referring to FIG. 6, the section of the first signal line 21 on a first end (such as the section shown in FIG. 6) is a first shape, the section of the second signal line 22 on the first end is a second shape, and the section of the third signal line 23 on the first end is a third shape. The geometric center of the first shape is O1, the geometric center of the second shape is O2, and the geometric center of the third shape is O3. In the first direction x, the geometric center O3 of the third shape is located between the geometric center O1 of the first shape and the geometric center O2 of the second shape. The first direction x is perpendicular to the extension direction of the third signal line 23, and the first end is perpendicular to the plane where the substrate 10 is located and intersects with the extension direction of the third signal line 23. In some embodiments, the first end may be perpendicular to the extension direction of the third signal line 23. In other words, the first end is parallel to the first direction x and perpendicular to the plane where the substrate 10 is located. In this manner, the third signal line 23 can overlap both the first signal line 21 and the second signal line 22, so as to avoid the uniformity of display brightness being affected by the deviation of the third signal line 23 due to process fluctuation. Therefore, a larger number of signal lines can be disposed in the same space while the display effect is ensured, so that the effect of reducing the area of the first fan-out region FA1 is achieved to achieve the narrow bezel.

Figure 13:
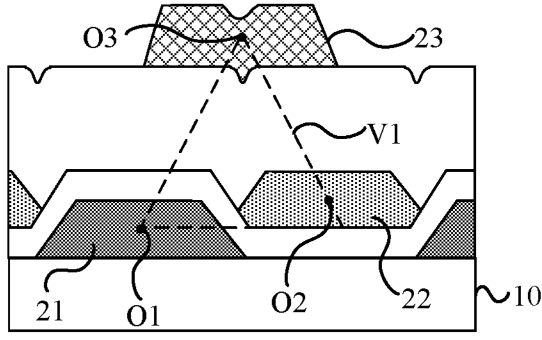
FIG. 13 is another sectional view of the display panel taken along BB' in FIG. 5.

Further, FIG. 13 is another sectional view of the display panel taken along BB' in FIG. 5. In FIG. 13, only one group of a first signal line 21, a second signal line 22 and a third signal line 23 is illustrated, and the third signal line 23 overlaps both the first signal line 21 and the second signal line 22. As shown in FIG. 13, in some embodiments, O1, O2 and O3 may each be located on a first virtual isosceles triangle V1, where O3 coincides with the intersection point of two legs of the first virtual isosceles triangle V1, O1 coincides with the other vertex of a leg of the first virtual isosceles triangle V1, and O2 is located on the other leg of the first virtual isosceles triangle V1. In this manner, since the vertical distance between the first signal line 21 and the second signal line 22 in the direction perpendicular to the plane where the substrate 10 is located is relatively small, when O1, O2 and O3 are all located on the first virtual isosceles triangle V1, the capacitance impact of the third signal line 23 on the first signal line 21 can be substantially the same as the capacitance impact of the third signal line 23 on the second signal line 22, so that the uniformity of display brightness is further ensured and the display effect is ensured. In the actual manufacturing process, positions of O1, O2 and O3 may be determined by the determination of positions of vertices of the first virtual isosceles triangle V1, and then positions for disposing the first signal line 21, the second signal line 22 and the third signal line 23 are determined.

Figure 14:
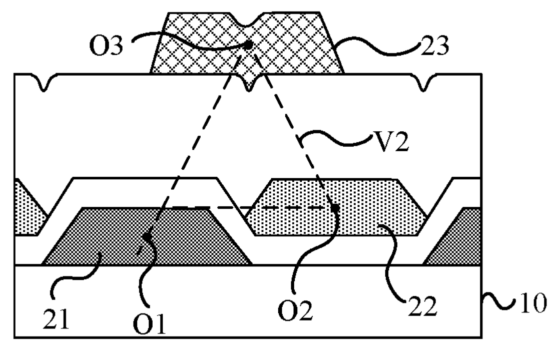
FIG. 14 is another sectional view of the display panel taken along BB' in FIG. 5.

Of course, the design manner shown in FIG. 13 is not limiting; in other words, the selection of the virtual isosceles triangle is not unique, and the position relationship between O1, O2 and O3 and the virtual isosceles triangle may be changed accordingly. In some embodiments, FIG. 14 is another sectional view of the display panel taken along BB' in FIG. 5. As shown in FIG. 14, in the embodiment, O2 and O3 may each be located on a second virtual isosceles triangle V2, where O3 coincides with the intersection point of two legs of the second virtual isosceles triangle V2, O2 coincides with the other vertex of a leg of the second virtual isosceles triangle V2, and O1 is located on the extension line of the other leg of the second virtual isosceles triangle V2. The second virtual isosceles triangle V2 and the first virtual isosceles triangle V1 are similar triangles. In this manner, similarly, the overlapping area between the third signal line 23 and the first signal line 21 can be substantially the same as the overlapping area between the third signal line 23 and the second signal line 22, and the capacitance impact of the third signal line 23 on the first signal line 21 can be substantially the same as the capacitance impact of the third signal line 23 on the second signal line 22, so that the uniformity of display brightness is further ensured and the display effect is ensured.

It is to be noted that the preceding relative position relationship between O1, O2 and O3 and the vertices or legs of the virtual isosceles triangles is an ideal position relationship. In fact, since process errors exist, a certain error range is allowed for the preceding relative position relationship between O1, O2 and O3 and the vertices or legs of the virtual isosceles triangles.

Figure 15:
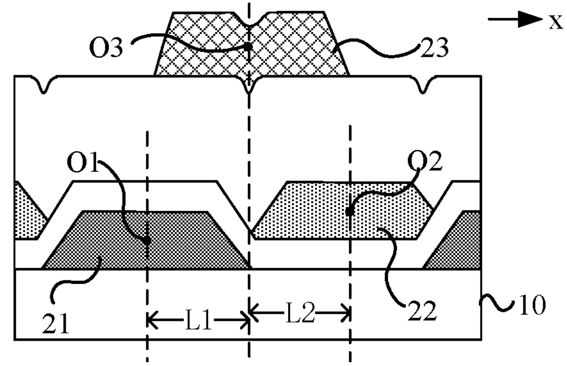
FIG. 15 is another sectional view of the display panel taken along BB' in FIG. 5.

In addition, FIG. 15 is another sectional view of the display panel taken along BB' in FIG. 5. As shown in FIG. 15, in some embodiments, in the first direction x, the distance L1 from O1 to O3 is equal to the distance L2 from O3 to O2. In this manner, the overlapping area between the third signal line 23 and the first signal line 21 can be equal to the overlapping area between the third signal line 23 and the second signal line 22, and the capacitance impact of the third signal line 23 on the first signal line 21 can be the same as the capacitance impact of the third signal line 23 on the second signal line 22, so that the uniformity of display brightness is further ensured. Moreover, the distance L1 from O1 to O3 is equal to the distance L2 from O3 to O2, so that positions of O1, O2 and O3 are easier to determined, which is conducive to reducing process difficulty.

It is to be noted that the distance from O1 to O3 set to be equal to the distance from O3 to O2 in the embodiment of the present disclosure is only an ideal case. In fact, since process errors exist, a certain error range is allowed for the distance from O1 to O3, and a certain error range is allowed for the distance from O2 to O3.

In summary, the preceding embodiments illustrate in detail the relative position relationship and setting manner of the third signal line 23 and the first signal line 21 and the second signal line 22 which overlap the third signal line 23 on the first end (the first end is perpendicular to the plane where the substrate 10 is located and intersects with the extension direction of the third signal line 23). Next, the arrangement manner of the first signal lines 21, the second signal lines 22 and the third signal lines 23 is further described.

First, in general, regardless of how the first signal lines 21 and the second signal lines 22 are arranged, when the third signal lines 23 are formed, it is only necessary to ensure that a third signal line 23 overlaps both an adjacent first signal line 21 and an adjacent second signal line 22.

Figure 16:
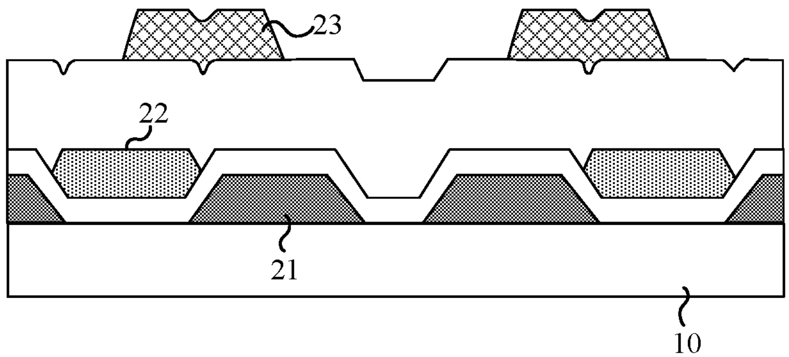
FIG. 16 is another sectional view of the display panel taken along BB' in FIG. 5.

In some embodiments, as shown in FIG. 6, the arrangement rule of the first signal lines 21 and the second signal lines 22 may be as: a first signal line 21, a second signal line 22, a second signal line 22, a first signal line 21, a second signal line 22, a second signal line 22 . . . ; and a third signal line 23 overlaps both a first signal line 21 and a second signal line 22. FIG. 16 is another sectional view of the display panel taken along BB' in FIG. 5. As shown in FIG. 16, the arrangement rule of the first signal lines 21 and the second signal lines 22 may be as: a second signal line 22, a first signal line 21, a first signal line 21, a second signal line 22, a first signal line 21, a first signal line 21 . . . ; and a third signal line 23 overlaps both a first signal line 21 and a second signal line 22. In addition, the arrangement manner of the first signal lines 21 and the second signal lines 22 may be as: a first signal line 21, a second signal line 22, a second signal line 22, a first signal line 21, a first signal line 21, a second signal line 22, a second signal line 22, a first signal line 21 . . . ; the arrangement manner of the first signal lines 21 and the second signal lines 22 is not limited in the embodiment of the present disclosure.

Figure 17:
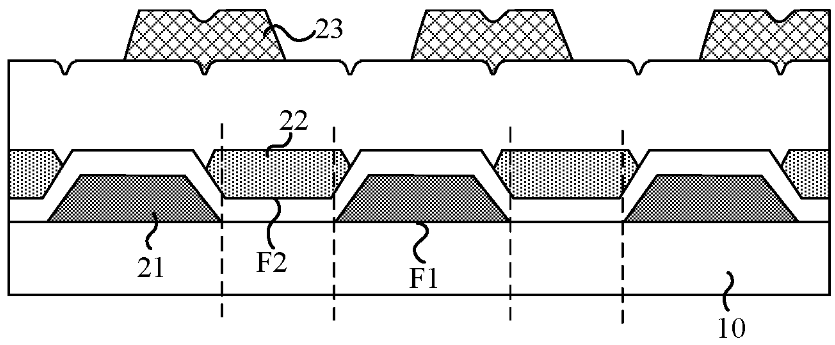
FIG. 17 is another sectional view of the display panel taken along BB' in FIG. 5.

In some embodiments, FIG. 17 is another sectional view of the display panel taken along BB' in FIG. 5. As shown in FIG. 17, in some embodiments, the first signal lines 21 may alternate with the second signal lines 22.

In this manner, an insulation layer is disposed between the first signal lines 21 and the second signal lines 22, and the first signal lines 21 alternate with the second signal line 22, so that the distance between a first signal line 21 and a second signal line 22 can be reduced as much as possible under the premise of ensuring the line width of the signal lines, thus the space utilization rate can be improved, and a larger number of first signal lines 21 and second signal lines 22 can be disposed in the same space, which is conducive to reducing the area of the first fan-out region FA1. Further, in conjunction with the design of the third signal lines 23 in the embodiment of the present disclosure, a third signal line 23 overlaps both a first signal line 21 and a second signal line 22, so that the area of the first fan-out region FA1 can be further reduced to achieve the narrow bezel; at the same time, the impact of process fluctuation on brightness uniformity can be avoided, and the display effect can be ensured.

Further, with continued reference to FIG. 17, a first signal line 21 and a second signal line 22 adjacent to the first signal line 21 belong to a group, and at least one group of a first signal line 21 and a second signal line 22 is correspondingly provided with a third signal line 23.

In some embodiments, when the first signal lines 21 alternate with the second signal lines 22, in the arrangement direction of the first signal lines 21 and the second signal lines 22, the left side and the right side of a first signal line 21 both includes a second signal line 22, and the first signal line 21 and one of the second signal lines 22 adjacent to the first signal line 21 may form a group. Further, each group of the first signal line 21 and the second signal line 22 may or may not be correspondingly provided with a third signal line 23, and a corresponding arrangement manner may be specifically selected according to the total number of the signal lines.

Figure 18:
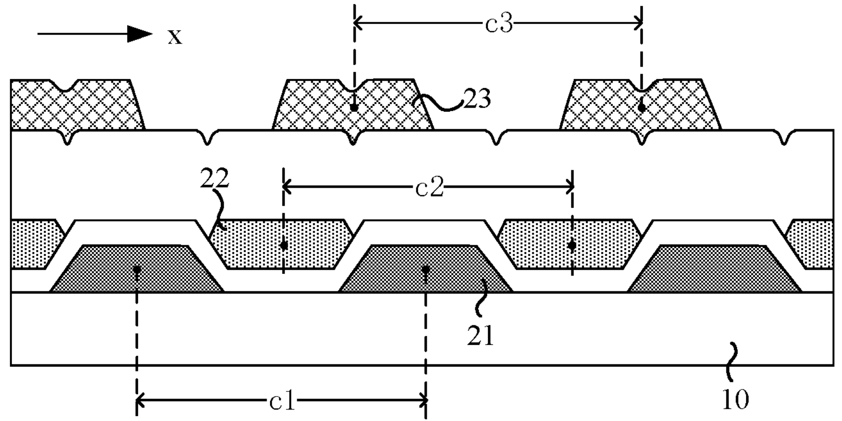
FIG. 18 is another sectional view of the display panel taken along BB' in FIG. 5.

In some embodiments, in FIG. 17, any first signal line 21 and the second signal line 22 on the right side of the first signal line 21 form a group, and each group of the first signal line 21 and the second signal line 22 is correspondingly provided with a third signal line 23. In this manner, a larger number of signal lines can be disposed in the same space as much as possible, so that the area of the fan-out region can be effectively reduced to achieve the narrow bezel while the display effect is ensured. This setting manner is not limiting. FIG. 18 is another sectional view of the display panel taken along BB' in FIG. 5. As shown in FIG. 18, in other embodiments, any first signal line 21 and the second signal line 22 on the left side of the first signal line 21 may form a group, and each group of the first signal line 21 and the second signal line 22 is correspondingly provided with a third signal line 23. This setting manner has the same effect as the setting manner shown in FIG. 17, which is not repeated here.

It is to be noted that FIGS. 15 and 16 only illustrate the example in which different first signal lines 21 and adjacent second signal lines 22 on the same side of the different first signal lines form groups, and in other embodiments, different first signal lines 21 and adjacent second signal lines 22 on different sides of the different first signal lines may form groups, as long as that different groups of first signal lines 21 and second signal lines 22 do not include the same first signal line 21 or the same second signal line 22.

Referring to FIG. 17, the first signal line 21 includes a first surface F1 facing a substrate 10 side, the second signal line 22 includes a second surface F2 facing the substrate 10 side, and in some embodiments, for any first signal line 21 and second signal line 22 adjacent to each other, the orthographic projection of the first surface F1 on the substrate 10 is contiguous to the orthographic projection of the second surface F2 on the substrate 10. As shown in FIG. 17, the left side end point of the first surface F1 of any first signal line 21 is located on the same dotted line as the right side end point of the second surface F2 of the second signal line 22 on the left side of and adjacent to the first signal line 21, and the right side end point of the first surface F1 of the first signal line 21 is located on the same dotted line as the left side end point of the second surface F2 of the second signal line 22 on the right side of and adjacent to the first signal line 21, so that for any first signal line 21 and second signal line 22 adjacent to each other, the orthographic projection of the first surface F1 on the substrate 10 is contiguous to the orthographic projection of the second surface F2 on the substrate 10. In this manner, the arrangement of the first signal lines 21 and the second signal lines 22 can be more compact, which is more conducive to reducing the area of the first fan-out region FA1.

Referring to FIG. 18, in the first direction x, the distance between two adjacent first signal lines 21 is c1, the distance between two adjacent second signal lines 22 is c2, and the distance between two adjacent third signal lines 23 is c3, where the first direction x is perpendicular to the extension direction of the third signal line 23, and in some embodiments, c1=c2.

As shown in FIG. 18, the distance between two adjacent first signal lines 21 in the first direction x may be understood as the distance between geometric centers of shapes of sections of two adjacent first signal lines 21 in the direction perpendicular to the plane (sections shown in FIG. 18) where the substrate 10 is located. Similarly, the distance between two adjacent second signal lines 22 in the first direction x may be understood as the distance between geometric centers of shapes of sections of two adjacent second signal lines 22 in the direction perpendicular to the plane where the substrate 10 is located, and the distance between two adjacent third signal lines 23 in the first direction x may be understood as the distance between geometric centers of shapes of sections of two adjacent third signal lines 23 in the direction perpendicular to the plane where the substrate 10 is located. In the embodiment of the present disclosure, it is set that c1=c2, so that the first signal lines 21 alternate with the second signal lines 22 evenly. In addition, if the width of the first signal line 21 is equal to the width of the second signal line 22, the first signal lines 21 and the second signal lines 22 may be formed by using the same mask plate, so as to reduce the production cost.

Further, with continued reference to FIG. 18, in some embodiments, it may be set that c3>c1. FIG. 18 illustrates the example in which c3=c1.

In some embodiments, as shown in FIG. 17 or FIG. 18, when each group of the first signal line 21 and the second signal line 22 is correspondingly provided with a third signal line 23, it may be set that c3=c1, so that a larger number of signal lines can be disposed in the same space as much as possible, and thus the area of the fan-out region can be effectively reduced to achieve the narrow bezel. In addition, if the width of the third signal line 23 is equal to the width of the first signal line 21, the first signal lines 21, the second signal lines 22 and the third signal lines 23 may be formed by using the same mask plate, so as to reduce the production cost.

In other embodiments, it may be set that c3>c1. At this time, the density of the third signal lines 23 is less than the density of the first signal lines 21, in other words, the number of third signal lines 23 in the same space is less than the number of first signal lines 21, so that the distance between adjacent third signal lines 23 can be increased, and thus the process adjustment on the third signal lines 23 can be more flexible; in addition, the impact of the line width of the third signal lines 23 can be avoided on the characteristics of devices disposed in the same layer as the third signal lines 23, which is illustrated through examples later.

Figure 19:
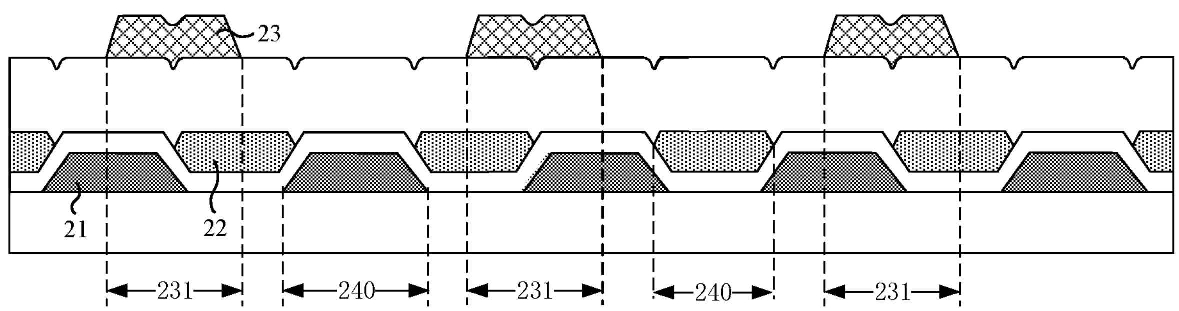
FIG. 19 is another sectional view of the display panel taken along BB' in FIG. 5.
Figure 20:
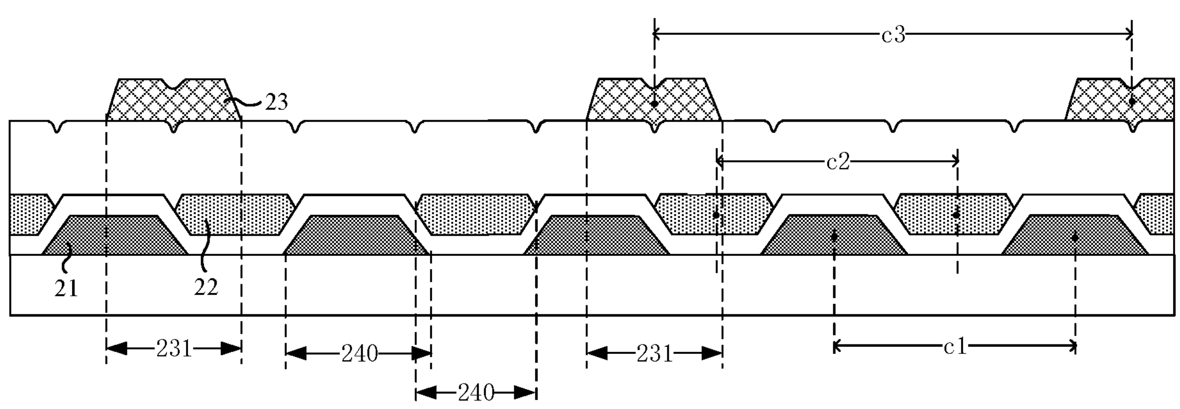
FIG. 20 is another sectional view of the display panel taken along BB' in FIG. 5.

In some embodiments, FIG. 19 is another sectional view of the display panel taken along BB' in FIG. 5, and FIG. 20 is another sectional view of the display panel taken along BB' in FIG. 5. As shown in FIG. 19 and FIG. 20, when c3>c1, in some embodiments, at least one dummy signal line 240 is included between orthographic projections 231 of two adjacent third signal lines 23 on the substrate 10, where the dummy signal line 240 is the orthographic projection of at least one first signal line 21 on the substrate 10 and/or the orthographic projection of at least one second signal line 22 on the substrate 10.

As an optional implementation, only a dummy signal line 240 is included between orthographic projections 231 of two adjacent third signal lines 23 on the substrate 10. At this time, the dummy signal line 240 may be the orthographic projection of the first signal line 21 on the substrate 10 or the orthographic projection of the second signal line 22 on the substrate 10. In some embodiments, as shown in FIG. 19, an dummy signal line 240 is included between orthographic projections 231 of any two adjacent third signal lines 23 on the substrate 10, part of dummy signal lines 240 are orthographic projections of the first signal lines 21 on the substrate 10, and the other part of dummy signal lines 240 are orthographic projections of the second signal lines 22 on the substrate 10.

In another optional implementation, two or more dummy signal lines 240 may be included between orthographic projections 231 of two adjacent third signal lines 23 on the substrate 10. At this time, the dummy signal lines 240 may be the orthographic projection of at least one first signal line 21 on the substrate 10 and the orthographic projection of at least one second signal line 22 on the substrate 10. In other words, the orthographic projection of at least one first signal line 21 on the substrate 10 and the orthographic projection of at least one second signal line 22 on the substrate 10 may be included between orthographic projections 231 of two adjacent third signal lines 23 on the substrate 10. In some embodiments, as shown in FIG. 20, two dummy signal lines 240 are included between orthographic projections 231 of any two adjacent third signal lines 23 on the substrate 10, and the two dummy signal lines 240 are the orthographic projection of a first signal line 21 on the substrate 10 and the orthographic projection of a second signal line 22 on the substrate 10, respectively. When c1=c2, the setting manner shown in FIG. 20 is such that c3=2*c1.

It is to be noted that FIG. 19 and FIG. 20 both illustrate examples in which the same number of dummy signal lines 240 are included between orthographic projections of two adjacent third signal lines 23 on the substrate 10. This setting manner is not limiting, and in other embodiments, different numbers of dummy signal lines 240 may be included between orthographic projections of two adjacent third signal lines 23 on the substrate 10.

Figure 21:
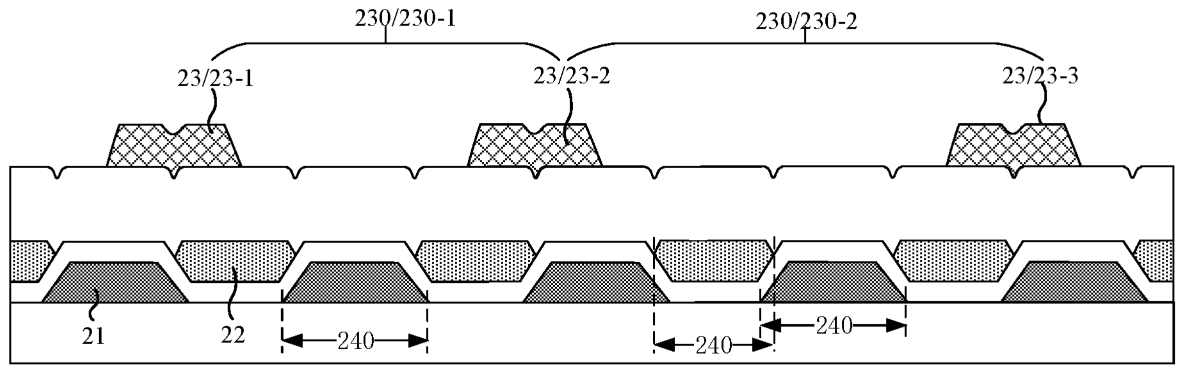
FIG. 21 is another sectional view of the display panel taken along BB' in FIG. 5.

FIG. 21 is another sectional view of the display panel taken along BB' in FIG. 5. As shown in FIG. 21, in other embodiments, two adjacent third signal lines 23 may belong to a third signal line group 230, N (for example, N=1) dummy signal lines 240 are included between third signal lines 23 in a third signal line group (for example, third signal line group 230-1), and M (for example, M=2) dummy signal lines 240 are included between third signal lines 23 in the other third signal line group (for example, third signal line group 230-2), where M is not equal to N.

In some embodiments, as shown in FIG. 21, third signal line 23-1 and third signal line 23-2 belong to third signal line group 230-1. In third signal line group 230-1, a dummy signal line 240 is included between third signal line 23-1 and third signal line 223-2, and the dummy signal line 240 is, specifically, the orthographic projection of a first signal line 21 on the substrate 10. In addition, third signal line 23-2 and third signal line 23-3 may belong to third signal line group 230-2. In third signal line group 230-2, two dummy signal lines 240 are included between third signal line 23-2 and third signal line 23-3, and the two dummy signal lines 240 are the orthographic projection of a first signal line 21 on the substrate 10 and the orthographic projection of a second signal line 22 on the substrate 10, respectively.

As shown in FIGS. 17 to 19, the dummy signal line 240 may not overlap the orthographic projection of the third signal line 23 on the substrate 10. Thus, the orthographic projection of at least one complete first signal line 21 on the substrate 10 and/or the orthographic projection of at least one complete second signal line 22 on the substrate 10 may be included between orthographic projections of two adjacent third signal lines 23 on the substrate 10. In this manner, it is ensured that a third signal line 23 overlaps only both one first signal line 21 and one second signal line 22, and at the same time, it is ensured that a sufficient distance exists between adjacent third signal lines 23 for flexible process adjustment on the third signal lines 23.

In addition, referring to FIG. 19 and FIG. 20, the distance c3 between any two adjacent third signal lines 23 is same, so that overlapping conditions of different third signal lines 23 with corresponding first signal lines 21 and second signal lines 22 can be same, which is conducive to improving the uniformity of display brightness.

In summary, the preceding embodiments describe in detail the arrangement manners of the first signal lines 21, the second signal lines 22 and the third signal lines 23, and those skilled in the art may select a suitable arrangement manner according to practical requirements.

Figure 22:
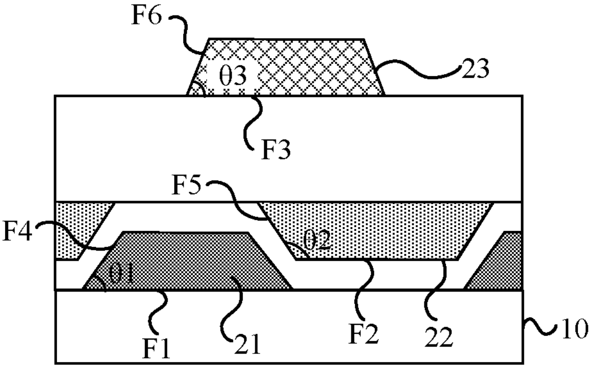
FIG. 22 is another sectional view of the display panel taken along BB' in FIG. 5.

FIG. 22 is another sectional view of the display panel taken along BB' in FIG. 5. As shown in FIG. 22, the first signal line 21 includes a first sidewall F4 and a first surface F1 facing the substrate 10 side, where the first surface F1 intersects with the first sidewall F4; the third signal line 23 includes a third sidewall F6 and a third surface F3 facing the substrate 10 side, where the third surface F3 intersects with the third sidewall F6. The included angle θ1 between the first sidewall F4 and the first surface F1 is an acute angle, and the included angle θ3 between the third sidewall F6 and the third surface F3 is an acute angle. In some embodiments, in the process of etching and forming the first signal lines 21, the amount of side etching on the surface of the first metal layer far away from the substrate 10 side is relatively large due to a relatively high concentration of the etching gas or etching liquid, so that the width of the first surface F1 of the first signal line 21 facing the substrate 10 side is greater than the width of the surface of the first signal line 21 far away from the substrate 10 side, and thus the included angle between the first sidewall F4 and the first surface F1 is an acute angle. Similarly, the included angle between the third surface F3 of the third signal line 23 and the third side wall F6 of the third signal line 23 is an acute angle.

Further, as shown in FIG. 22, in some embodiments, the included angle θ1 between the first sidewall F4 and the first surface F1 is less than the included angle θ3 between the third sidewall F6 and the third surface F3. In some embodiments, the included angle θ1 between the first sidewall F4 and the first surface F1 may be 29°, and the included angle θ3 between the third sidewall F6 and the third surface F3 may be 50.6°.

With continued reference to FIG. 22, the second signal line 22 includes a second sidewall F5 and a second surface F2 facing the substrate 10 side, where the second surface F2 intersects with the second sidewall F5; in some embodiments, the included angle θ1 between the first sidewall F4 and the first surface F1 and the included angle θ2 between the second sidewall F5 and the second surface F2 may be supplementary to each other. In this manner, the second signal lines 22 may be used for filling the steps on the insulation layer above the first signal lines 21, which facilitates the planarization of the film layer and thus is conducive to improving the flatness of the upper third signal lines 23.

In some embodiments, positions of film layers of the first signal lines 21, the second signal lines 22 and the third signal lines 23 are further described in detail.

In some embodiments, the display panel 100 further includes an array layer located on a side of the substrate 10, where the first signal lines 21, the second signal lines 22 and the third signal lines 23 are disposed in the same layers as three conductive layers which are disposed in different layers in the array layer, respectively.

The array layer specifically refers to a film layer where light emission control circuits arranged in an array corresponding to subpixels PX are located in the display region DA. The array layer includes multiple conductive layers disposed in different layers for forming structures such as circuit elements and signal traces in the light emission control circuits. In the embodiment, the first signal lines 21, the second signal lines 22 and the third signal lines 23 are disposed in the same layers as three conductive layers which are disposed in different layers in the array layer, respectively, so that the first signal lines 21, the second signal lines 22 and the third signal lines 23 can be formed by using the existing conductive film layers, thereby avoiding an additional increase in the number of film layers of the display panel and facilitating the thin design of the display panel.

Different types of display panels have different specific structures of array layers due to different structures of light emission control circuits; and exemplary illustration is made below for different types of display panels.

In some embodiments, the display panel may be a light emitting diode (LED) display panel, such as an organic light emitting diode (OLED) display panel, a micro light emitting diode (micro-LED) display panel, a mini light emitting diode (mini-LED) display panel, etc. Correspondingly, in some embodiments, the array layer includes thin-film transistors and storage capacitors, a storage capacitor includes a first capacitor plate and a second capacitor plate, and a thin-film transistor includes an active layer, a gate and a source-drain layer. The first signal lines 21, the second signal lines 22 and the third signal lines 23 are disposed in the same layers as three of the gate of the thin-film transistor, the source-drain layer of the thin-film transistor, the first capacitor plate and the second capacitor plate which are disposed in different layers, respectively.

An OLED display panel is taken as an example. The OLED display panel includes light-emitting elements (that is, OLEDs) arranged in an array corresponding to various subpixels. Correspondingly, the array layer includes pixel circuits (that is, the preceding light emission control circuits) arranged in an array, and the pixel circuits are used for driving the corresponding light-emitting elements to emit light. A pixel circuit may be composed of several thin-film transistors and storage capacitors. For example, a currently mainstream 7T1C pixel circuit, where T represents a thin-film transistor and C represents a capacitor, is composed of seven thin-film transistors and one storage capacitor.

Figure 23:
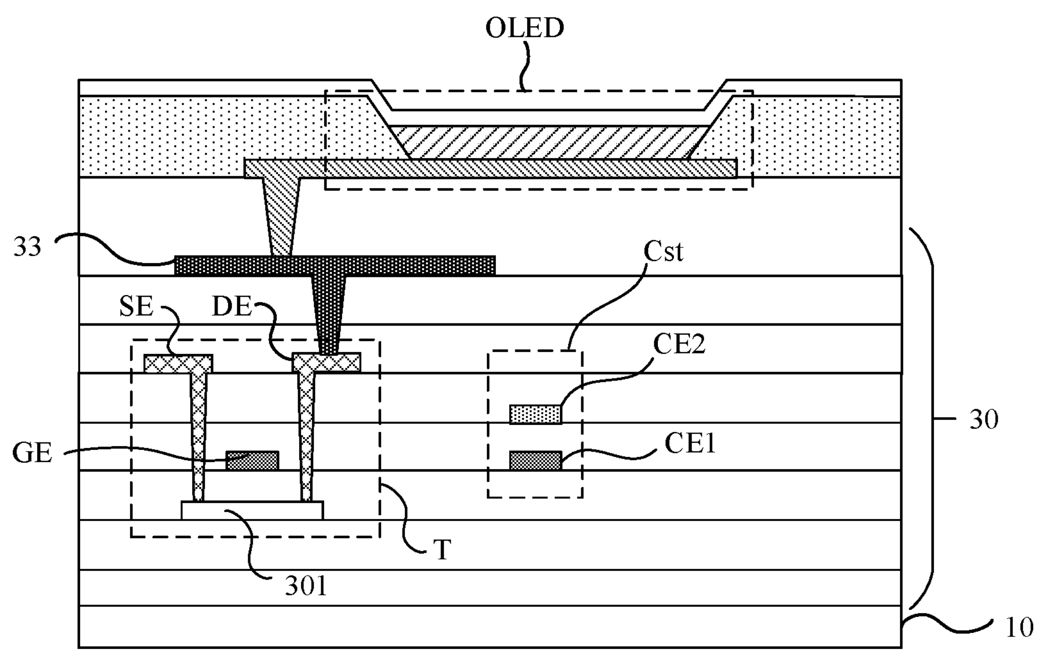
FIG. 23 is a sectional view of the display panel taken along CC' in FIG. 5.

FIG. 23 is a sectional view of the display panel taken along CC' in FIG. 5, illustrating a sectional structure of an organic light-emitting diode (OLED) and a thin-film transistor T and a storage capacitor Cst in a pixel circuit. As shown in FIG. 23, the thin-film transistor T mainly includes an active layer 301, a gate GE, a source SE and a drain DE, where the source SE and the drain DE are usually located in the same film layer, that is, a source-drain layer; and the storage capacitor Cst includes a first capacitor plate CE1 and a second capacitor plate CE2 which are oppositely disposed in an insulation manner. Since the gate GE, the source SE, the drain DE, the first capacitor plate CE1 and the second capacitor plate CE2 are all conductive structures, the first signal lines 21, the second signal lines 22 and the third signal lines 23 may be disposed in the same layers as three of the gate GE of the thin-film transistor T, the source-drain layer of the thin-film transistor T, the first capacitor plate CE1 and the second capacitor plate CE2 which are disposed in different layers, respectively, so as to avoid adding additional film layer structures to the display panel and satisfy the design requirements for a thin display panel.

In addition, as shown in FIG. 23, the array layer 30 further includes a metal layer 33 for connecting the thin-film transistor T and the organic light-emitting diode (OLED). In the thickness direction of the display panel, the first signal lines 21, the second signal lines 22, and/or the third signal lines 23 may also be selected to be disposed in the same layer as the metal layer 33, as long as the relative position relationship between the first signal lines 21, the second signal lines 22 and the third signal lines 23 is satisfied.

It is to be noted that the drawings of the present application indicate in the same filling manner that different conductive structures in different regions are located in the same film layer, which is not repeated subsequently. In some embodiments, referring to FIG. 22 and FIG. 23, in some embodiments, the first capacitor plate CE1 is disposed in the same layer as the gate GE of the thin-film transistor T, the first signal lines 21 are disposed in the same layer as the gate GE of the thin-film transistor T, the second signal lines 22 are disposed in the same layer as the second capacitor plate CE2, and the third signal lines 23 are disposed in the same layer as the source-drain layer (that is, the film layer where the source SE and the drain DE are located).

Figure 24:
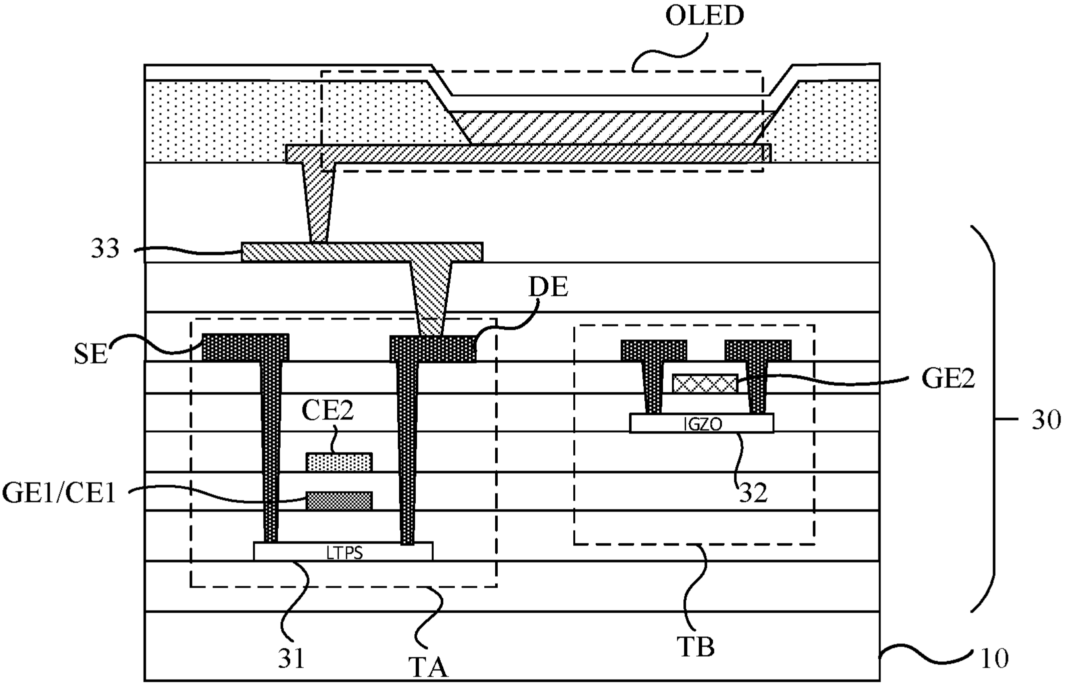
FIG. 24 is another sectional view of the display panel taken along CC' in FIG. 5.

Further, FIG. 24 is another sectional view of the display panel taken along CC' in FIG. 5. As shown in FIG. 23, in some embodiments, the thin-film transistor may include first type thin-film transistors TA and second type thin-film transistors TB, where a first type thin-film transistor TA includes a polycrystalline silicon active layer 31 and a first gate GE1, and a second type thin-film transistor TB includes an oxide semiconductor active layer 32 and a second gate GE2. The first gate GE1 is located on the side of the polycrystalline silicon active layer 31 far away from the substrate 10 and is multiplexed as the first capacitor plate CE1; and the second capacitor plate CE2 is located on the side of the first gate GE1 far away from the substrate 10. The oxide semiconductor active layer 32 is located on the side of the second capacitor plate CE2 far away from the substrate 10, and the second gate GE2 is located on the side of the oxide semiconductor active layer 32 far away from the substrate 10. The first signal lines 21 are disposed in the same layer as the first gate GE1, the second signal lines 22 are disposed in the same layer as the second capacitor plate CE2, and the third signal lines 23 are disposed in the same layer as the second gate GE2.

In the embodiment, the thin-film transistor in the pixel circuit may include both first type thin-film transistors TA and second type thin-film transistors TB. As shown in FIG. 24, a first type thin-film transistor TA includes a polycrystalline silicon active layer 31, and a second type thin-film transistor TB includes an oxide semiconductor active layer 32. The pixel circuit includes two types of transistors, so that different advantages of the two types of transistors can be fully used to ensure the excellent performance of the pixel circuit.

In some embodiments, as shown in FIG. 24, the first type thin-film transistor TA includes the polycrystalline silicon active layer 31. For example, the first type thin-film transistor TA may be a low-temperature poly-silicon (LTPS) transistor, with advantages of high switching speed, high carrier mobility and low power consumption. The second type thin-film transistor TB includes the oxide semiconductor active layer 32. For example, the second type thin-film transistor TB is an indium gallium zinc oxide (IGZO) transistor, with advantages of a simple manufacturing process and a small leakage current. The pixel circuit provided in the embodiment of the present disclosure includes both first type thin-film transistors TA and second type thin-film transistors TB, so that a low-temperature polycrystalline oxide (LTPO) circuit can be formed, and the advantages of different transistors can be fully used to ensure excellent performance and high driving efficiency of the pixel circuit.

Figure 25:
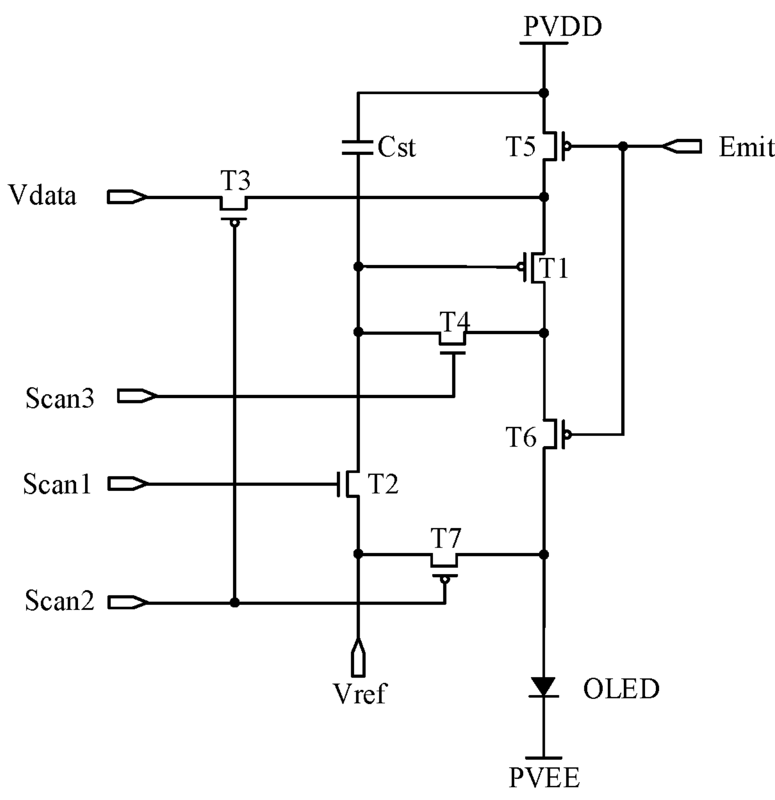
FIG. 25 is a diagram of a pixel circuit corresponding to FIG. 24.

In some embodiments, FIG. 25 is a diagram of a pixel circuit corresponding to FIG. 24. As shown in FIG. 25, the pixel circuit includes a drive transistor T1, an initialization transistor T2, a data write transistor T3, a threshold compensation transistor T4, a first light emission control transistor T5, a second light emission control transistor T6, a reset transistor T7 and a storage capacitor Cst, which can compose a 7T1C pixel circuit. In some embodiments, the drive transistor T1, the data write transistor T3, the first light emission control transistor T5, the second light emission control transistor T6 and the reset transistor T7 are first type thin-film transistors TA such as LTPS transistors, and the initialization transistor T2 and the threshold compensation transistor T4 may be second type thin-film transistors TB such as IGZO transistors.

Figure 26:
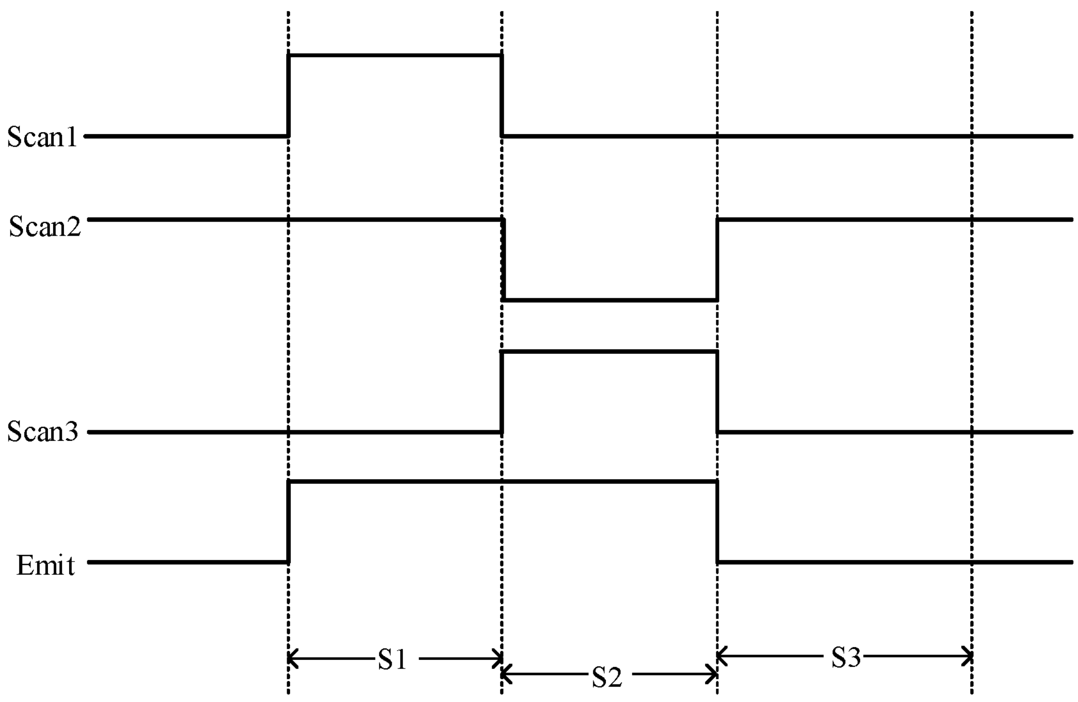
FIG. 26 is a drive timing diagram of the pixel circuit in FIG. 25.

FIG. 26 is a drive timing diagram of the pixel circuit in FIG. 25. Referring to FIG. 25 and FIG. 26, the driving process of the pixel circuit includes an initialization stage S1, a data write stage S2 and a light emission stage S3. In some embodiments, in the initialization stage S1, the initialization transistor T2 is turned on under the control of a first scan control signal sent by a first scan control signal terminal Scant, so that an initialization signal of an initialization signal terminal Vref is written into the gate of the drive transistor T1, and then the gate of the drive transistor is initialized. In the data write stage S2, the data write transistor T3 is turned on under the control of a second scan control signal sent by a second scan control signal terminal Scan2, the threshold compensation transistor T4 is turned on under the control of a third scan control signal sent by a third scan control signal terminal Scan3, at the same time, the drive transistor T1 is turned on since a gate-source voltage satisfies a turned-on condition, so that the data write transistor T3 writes a data signal of a data signal terminal into the gate of the drive transistor T1, and at the same time, the threshold compensation transistor T4 compensates a threshold voltage of the drive transistor T1 to the gate of the drive transistor T1. In addition, in the data write stage S2, the reset transistor T7 may be turned on under the control of the second scan control signal sent by the second scan control signal terminal Scan2, write the initialization signal of the initialization signal terminal Vref into the anode of an organic light-emitting diode (OLED), and reset an anode voltage of the organic light-emitting diode (OLED). In the light emission stage S3, the first light emission control transistor T5 and the second light emission control transistor T6 are turned on under the control of a light emission control signal of a light emission control signal terminal Emit; and the storage capacitor Cst stores a gate potential of the drive transistor T1, so that the drive transistor T1 generates a drive current based on the gate potential and a potential of a first power signal terminal PVDD to drive the OLED to emit light. In FIG. 25, PVEE is a second power signal terminal, and a potential of the second power signal terminal is less than the potential of the first power signal terminal.

The advantage of the 7T1C pixel circuit is that the compensation for the threshold voltage of the drive transistor T1 is achieved by the threshold compensation transistor T4, so that the drive current of the drive transistor T1 is only related to the data signal (the PVDD is at a fixed potential), the adjustment of the display grayscale of subpixels can be achieved by adjusting the data signal, and the impact on the display effect due to the drift of the threshold voltage of the drive transistor T1 is avoided. In addition, in the embodiment, the drive transistor T1, the data write transistor T3, the first light emission control transistor T5, the second light emission control transistor T6 and the reset transistor T7 are the first type thin-film transistors TA such as LTPS transistors, so that the power consumption of the pixel circuit can be reduced and the response time of the pixel circuit can be shortened; the initialization transistor T2 and the threshold compensation transistor T4 are second type thin-film transistors TB such as IGZO transistors, so that the leakage current of the initialization transistor T2 and the threshold compensation transistor T4 can be reduced, the impact of the leakage current of the initialization transistor T2 and the threshold compensation transistor T4 on the gate potential of the drive transistor T1 can be reduced, and thus the performance of the pixel circuit can be further optimized.

As shown in FIG. 24, when the pixel circuit includes the first type thin-film transistors TA and the second type thin-film transistors TB, the conductive layers disposed in different layers in the array layer 30 include a film layer where the first gate GE1 is located, a film layer where the second capacitor plate CE2 is located, a film layer where the second gate GE2 is located, a source-drain layer where the source SE and the drain DE are located, and a metal layer 33 connecting the pixel circuit and the OLED, and at this time, the first signal lines 21, the second signal lines 22 and the third signal lines 23 may be disposed in the same layers as three lines disposed in different layers, respectively. In some embodiments, FIG. 24 only illustrates the example in which the first signal lines 21 are disposed in the same layer as the first gate GE1, the second signal lines 22 are disposed in the same layer as the second capacitor plate CE2, and the third signal lines 23 are disposed in the same layer as the second gate GE2. As described above, when the third signal lines 23 are disposed in the same layer as the second gate GE2, the distance between adjacent third signal lines 23 may be set to be greater than the distance between adjacent first signal lines 21 (that is, c3>c1), so as to reduce the impact of the line width of the third signal lines 23 on the characteristics of the second type thin-film transistors TB.

When the first signal lines 21 are disposed in the same layer as the first gate GE1, the second signal lines 22 are disposed in the same layer as the second capacitor plate CE2, and the third signal lines 23 are disposed in the same layer as the second gate GE2, in the direction perpendicular to the plane where the substrate 10 is located, in some embodiments, parameters of various film layers in the first fan-out region may be set as follows. Molybdenum (Mo) may be used for manufacturing the first signal lines 21, the thickness of the first signal lines 21 is 300 nm, and the angle between the sidewall and the bottom surface is 29°; SiN may be used for manufacturing the insulation layer between the first signal lines 21 and the second signal lines 22, and the thickness of the insulation layer is 130 nm; molybdenum (Mo) may be used for manufacturing the second signal lines 22, the thickness of the second signal lines 22 is 300 nm, and the angle between the sidewall and the bottom surface is 32.9°; three insulation layers are included between the second signal lines 22 and the third signal lines 23, in the direction from which the third signal lines 23 point to the second signal lines 22, SIOx, SIOx and SINx may be used for successively manufacturing the three insulation layers, respectively, and the thickness of the three insulation layers are 147 nm, 300 nm and 140 nm, respectively; molybdenum (Mo) or titanium (Ti) may be used for manufacturing the third signal lines 23, the thickness of the third signal lines may be 300 nm or 50 nm, and the angle between the sidewall and the bottom surface may be 50.6°. It is to be noted that the preceding setting parameters are merely illustrative and not limiting, and those skilled in the art may set the parameters of various film layers according to actual situations, which is not limited in the embodiment of the present disclosure.

Figure 27:
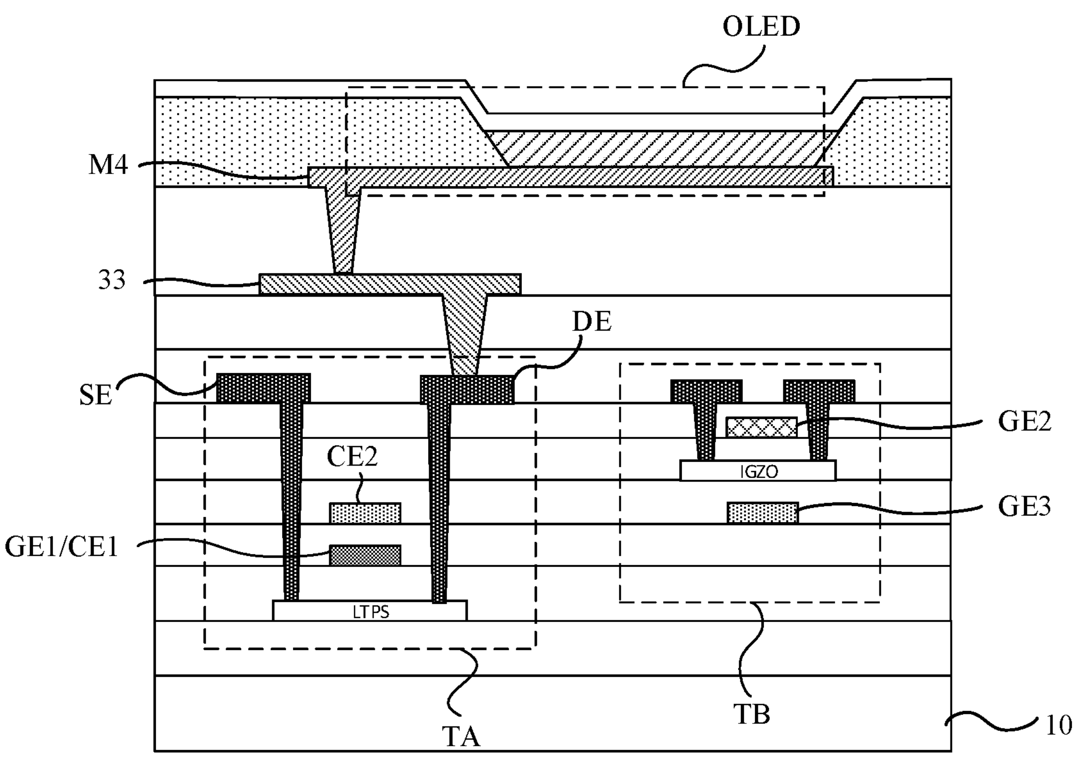
FIG. 27 is another sectional view of the display panel taken along CC' in FIG. 5.

In addition, FIG. 27 is another sectional view of the display panel taken along CC' in FIG. 5. As shown in FIG. 27, the second type thin-film transistor TB (such as the initialization transistor T2 and the threshold compensation transistor T4) may further include a third gate GE3. The third gate GE3 is located on the side of the second gate GE2 far away from the oxide semiconductor active layer 32, and thus a double-gate transistor can be formed, so that the leakage current of the initialization transistor T2 and the threshold compensation transistor T4 is further reduced, the stability of the gate potential of the drive transistor T1 is ensured, and the performance of the pixel circuit is optimized. In some embodiments, the third gate GE3 may be disposed in the same layer as the second capacitor plate CE2.

In summary, the preceding embodiments takes the OLED display panel as the example to illustrate in detail the positions of the film layers of the first signal lines 21, the second signal lines 22 and the third signal lines 23. In addition, in other embodiments, the display panel may be a liquid crystal display panel.

Figure 28:
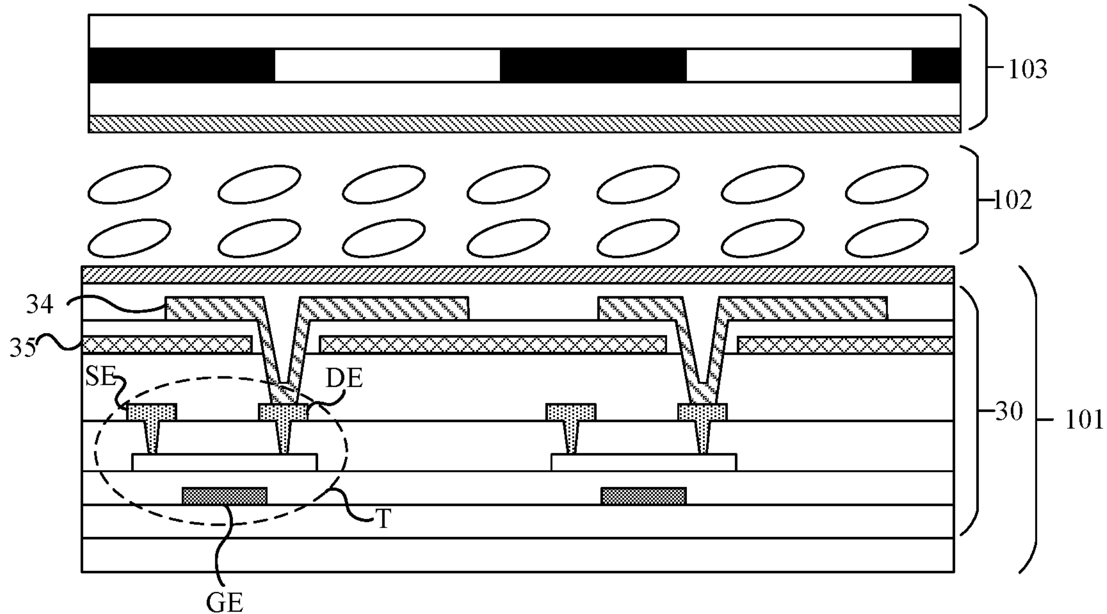
FIG. 28 is another sectional view of the display panel taken along CC' in FIG. 5.

In some embodiments, FIG. 28 is another sectional view of the display panel taken along CC' in FIG. 5. As shown in FIG. 28, the liquid crystal display panel includes an array base plate 101, an opposing base plate (such as a color film base plate) 103 and a liquid crystal layer 102 located between the array base plate 101 and the opposing base plate 103, and the array layer 30 is located on the array base plate 101. Within the display region DA, the array layer 30 mainly includes thin-film transistors T arranged in an array and pixel electrodes 34 electrically connected to the thin-film transistors T. A thin-film transistors T includes a gate GE, a source SE and a drain DE. In addition, the liquid crystal display panel further includes a common electrode layer 35. A common voltage is applied to the common electrode layer 35, and at the same time, a pixel voltage is applied to the corresponding pixel electrode 34 through the gating thin-film transistor T, so that an electric field can be formed under the effect of the potential difference between the pixel voltage and the common voltage, and thus liquid crystals are deflected under the effect of the electric field. Through the adjustment of the intensity of the electric field, the deflection angle of liquid crystals in the corresponding region can be controlled, so that the brightness of the light emitted by subpixels can be controlled. As shown in FIG. 27, the common electrode layer 35 may be located on the array base plate, and at this time, to avoid the common electrode layer 35 shielding from the electric field, in some embodiments, the common electrode layer 35 may be located on the side of the film layer where the pixel electrode 34 is located far away from the liquid crystal layer. In other embodiments, the common electrode layer 35 may be located on the opposing base plate, which is not limited in the embodiment of the present disclosure.

The liquid crystal display panel shown in FIG. 27 is taken as an example. In some embodiments, the first signal lines 21, the second signal lines 22 and the third signal lines 23 are disposed in the same layers as three signal lines of the gate GE of the thin-film transistor T, the source SE and the drain DE of the thin-film transistor T, the common electrode layer 35 and the pixel electrode 34 which are disposed in different layers, respectively. In some embodiments, in FIG. 27, the first signal lines 21 are disposed in the same layer as the gate GE of the thin-film transistor T, the second signal lines 22 are disposed in the same layer as the source-drain layer (that is, the film layer where the source SE and the drain DE are located) of the thin-film transistor T, and the third signal lines 23 are disposed in the same layer as the common electrode layer 35. In this manner, an additional increase in the number of film layers of the array base plate can be avoided, which is conducive to satisfying the design requirements for the thin liquid crystal display panel.

Figure 29:
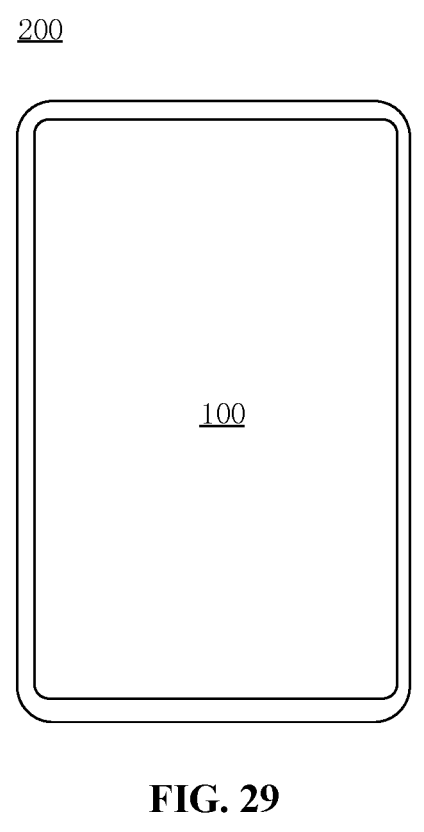

Based on the same concept, the embodiment of the present disclosure further provides a display device. FIG. 29 is a structural diagram of a display device according to the embodiment of the present disclosure. The display device 200 includes the display panel 100 provided in any of the preceding embodiments, thereby having the same beneficial effects as the preceding display panel. Similarities may be understood with reference to the description of the preceding display panel embodiments and are not repeated here. The display device 200 provided in the embodiment of the present disclosure may be the phone shown in FIG. 29, or may be any electronic product with the display function, including but not limited to the following categories: a television, a laptop, a desktop display, a tablet computer, a digital camera, a smart bracelet, smart glasses, a vehicle-mounted display, a medical device, an industrial control device, a touch interactive terminal, etc., and no special limitations are made thereto in the embodiment of the present disclosure.

The preceding specific embodiments are not construed as limitations on the scope of the present disclosure. It is to be understood by those skilled in the art that various modifications, combinations, sub-combinations and substitutions may be performed according to design requirements and other factors. Any modifications, equivalent substitutions, improvements and the like made within the spirit and principle of the present disclosure are within the scope of the present disclosure.

What is claimed is:

1. A display panel comprising a display region and a first fan-out region located on a side of the display region, wherein the display panel further comprises:

a substrate; and a first metal layer, a second metal layer and a third metal layer which are located on a side of the substrate and are located at the first fan-out region and are sequentially disposed in different layers insulated from one another, wherein the first metal layer comprises a plurality of first signal lines, the second metal layer comprises a plurality of second signal lines, and the third metal layer comprises a plurality of third signal lines;

wherein in a direction perpendicular to a plane where the substrate is located, at least one third signal line among the plurality of third signal lines overlaps a first signal line among the plurality of first signal lines, and the at least one third signal line overlaps a second signal line among the plurality of second signal lines;

wherein a cross-section of the first signal line on a first end is a first shape, a cross-section of the second signal line on the first end is a second shape, and a cross-section of the at least one third signal line on the first end is a third shape;

wherein in a first direction, an orthographic projection of a geometric center of the third shape on the substrate is located between an orthographic projection of a geometric center of the first shape on the substrate and an orthographic projection of a geometric center of the second shape on the substrate;

wherein the first direction is perpendicular to an extension direction of the plurality of third signal lines, and the first end is perpendicular to the plane where the substrate is located and perpendicular to the extension direction of the plurality of third signal lines.

2. The display panel according to claim 1, wherein the geometric center of the first shape is O1, the geometric center of the second shape is O2, and the geometric center of the third shape is O3; and O1, O2 and O3 are each located on a first virtual isosceles triangle, wherein O3 coincides with an intersection point of two legs of the first virtual isosceles triangle, O1 coincides with an other vertex of a leg of the first virtual isosceles triangle, and O2 is located on an other leg of the first virtual isosceles triangle; or O2 and O3 are each located on a second virtual isosceles triangle, wherein O3 coincides with an intersection point of two legs of the second virtual isosceles triangle, O2 coincides with an other vertex of a leg of the second virtual isosceles triangle, and O1 is located on an extension line of an other leg of the second virtual isosceles triangle.

3. The display panel according to claim 1, wherein the geometric center of the first shape is O1, the geometric center of the second shape is O2, and the geometric center of the third shape is O3; and in the first direction, a distance from O1 to O3 is equal to a distance from O3 to O2.

4. The display panel according to claim 1, wherein the plurality of first signal lines alternate with the plurality of second signal lines.

5. The display panel according to claim 4, wherein a first signal line and a second signal line adjacent to the one first signal line belong to a group, and at least one group of the first signal line and the second signal line is correspondingly provided with a third signal line among the plurality of third signal lines.

6. The display panel according to claim 5, wherein the first signal line comprises a first surface facing a substrate side, the second signal line comprises a second surface facing the substrate side, and for any first signal line and second signal line adjacent to each other, an orthographic projection of the first surface on the substrate is contiguous to an orthographic projection of the second surface on the substrate.

7. The display panel according to claim 5, wherein in a first direction, a distance bet ween adjacent two first signal lines among the plurality of first signal lines is c1, a distance between adjacent two second signal lines among the plurality of second signal lines is c2, and a distance between adjacent two third signal lines among the plurality of third signal lines is c3, wherein the first direction is perpendicular to an extension direction of the plurality of third signal lines, and $c1=c2$.

8. The display panel according to claim 7, wherein $c3 \geq c1$.

9. The display panel according to claim 8, wherein $c3>c1$, and at least one dummy signal line is comprised between orthographic projections of two adjacent third signal lines among the plurality of third signal lines on the substrate, wherein the at least one dummy signal line is an orthographic projection on the substrate of at least one first signal line among the plurality of first signal lines and/or an orthographic projection on the substrate of at least one second signal line among the plurality of second signal lines.

10. The display panel according to claim 9, wherein the at least one empty signal line does not overlap each of the orthographic projections of the two adjacent third signal lines on the substrate.

11. The display panel according to claim 9, wherein the two adjacent third signal lines among the plurality of third signal lines belongs to a third signal line group, N dummy signal lines are comprised between third signal lines in a third signal line group, and M dummy signal lines are comprised between third signal lines in an other third signal line group, wherein M is not equal to N.

12. The display panel according to claim 8, wherein $c3=2*c1$.

13. A display device, comprising the display panel according to claim 1.

14. A display panel comprising a display region and a first fan-out region located on a side of the display region, wherein the display panel further comprises:

a substrate; and a first metal layer, a second metal layer and a third metal layer which are located on a side of the substrate and are located at the first fan-out region and are sequentially disposed in different layers insulated from one another, wherein the first metal layer comprises a plurality of first signal lines, the second metal layer comprises a plurality of second signal lines, and the third metal layer comprises a plurality of third signal lines;

wherein in a direction perpendicular to a plane where the substrate is located, at least one third signal line among the plurality of third signal lines overlaps a first signal line among the plurality of first signal lines, and the at least one third signal line overlaps a second signal line among the plurality of second signal lines;

wherein the first signal line comprises a first sidewall and a first surface facing a substrate side, wherein the first surface intersects with the first sidewall; the third signal line comprises a third sidewall and a third surface facing the substrate side, wherein the third surface intersects with the third sidewall, an included angle between the first sidewall and the first surface is an acute angle, and an included angle between the third sidewall and the third surface is an acute angle.

15. The display panel according to claim 14, wherein the included angle between the first sidewall and the first surface is less than the included angle between the third sidewall and the third surface.

16. The display panel according to claim 14, wherein the second signal line comprises a second sidewall and a second surface close to the substrate side, wherein the second surface intersects with the second sidewall, and the included angle between the first sidewall and the first surface and an included angle between the second sidewall and the second surface are supplementary to each other.

17. A display panel comprising a display region and a first fan-out region located on a side of the display region, wherein the display panel further comprises:

a substrate;

an array layer located on a side of the substrate; and a first metal layer, a second metal layer and a third metal layer which are located on a side of the substrate and are located at the first fan-out region and are sequentially disposed in different layers insulated from one another, wherein the first metal layer comprises a plurality of first signal lines, the second metal layer comprises a plurality of second signal lines, and the third metal layer comprises a plurality of third signal lines;

wherein in a direction perpendicular to a plane where the substrate is located, at least one third signal line among the plurality of third signal lines overlaps a first signal line among the plurality of first signal lines, and the at least one third signal line overlaps a second signal line among the plurality of second signal lines;

wherein the plurality of first signal lines, the plurality of second signal lines and the plurality of third signal lines are disposed in same layers as three conductive layers which are disposed in different layers in the array layer, respectively.

18. The display panel according to claim 17, wherein the array layer comprises a thin-film transistor and a storage capacitor, the storage capacitor comprises a first capacitor plate and a second capacitor plate, and the thin-film transistor comprises an active layer, a gate and a source-drain layer; and the plurality of first signal lines, the plurality of second signal lines and the plurality of third signal lines are disposed in same layers as three of the gate of the thin-film transistor, the source-drain layer of the thin-film transistor, the first capacitor plate and the second capacitor plate which are disposed in different layers, respectively.

19. The display panel according to claim 18, wherein the thin-film transistor comprises a first type thin-film transistor and a second type thin-film transistor, the first type thin-film transistor comprises a polycrystalline silicon active layer and a first gate, and the second type thin-film transistor comprises an oxide semiconductor active layer and a second gate;

the first gate is located on a side of the polycrystalline silicon active layer far away from the substrate and is multiplexed as the first capacitor plate; and the second capacitor plate is located on a side of the first gate far away from the substrate;

the oxide semiconductor active layer is located on a side of the second capacitor plate far away from the substrate, and the second gate is located on a side of the oxide semiconductor active layer far away from the substrate; and the plurality of first signal lines are disposed in a same layer as the first gate, the plurality of second signal lines are disposed in a same layer as the second capacitor plate, and the plurality of third signal lines are disposed in a same layer as the second gate.

* * * * *